(12) United States Patent
Horbach et al.

(10) Patent No.: US 8,355,510 B2
(45) Date of Patent: Jan. 15, 2013

(54) REDUCED LATENCY LOW FREQUENCY EQUALIZATION SYSTEM

(75) Inventors: Ulrich Horbach, Canyon Country, CA (US); Adam Strauss, Santa Monica, CA (US); Pedro Manrique, Pasadena, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 1232 days.

(21) Appl. No.: 11/487,597

(22) Filed: Jul. 14, 2006

(65) Prior Publication Data

US 2007/0019826 A1    Jan. 25, 2007

Related U.S. Application Data

(63) Continuation-in-part of application No. 11/026,773, filed on Dec. 30, 2004.

(60) Provisional application No. 60/782,544, filed on Mar. 14, 2006.

(51) Int. Cl.
*H04R 29/00* (2006.01)
(52) U.S. Cl. ............... 381/59; 381/58; 381/98; 381/103
(58) Field of Classification Search .......... 381/98–103, 381/300, 303–307, 1–23, 56–59
See application file for complete search history.

(56) References Cited

U.S. PATENT DOCUMENTS

| | | | | |
|---|---|---|---|---|
| 5,511,129 A | * | 4/1996 | Craven et al. | 381/103 |
| 5,572,443 A | * | 11/1996 | Emoto et al. | 702/103 |
| 6,526,429 B1 | * | 2/2003 | Lai et al. | 708/300 |
| 7,567,675 B2 | * | 7/2009 | Bharitkar et al. | 381/17 |
| 7,769,183 B2 | * | 8/2010 | Bharitkar et al. | 381/59 |
| 8,218,789 B2 | * | 7/2012 | Bharitkar et al. | 381/98 |
| 2005/0157891 A1 | * | 7/2005 | Johansen | 381/103 |

OTHER PUBLICATIONS

Bruno Korst-Fagundes et al, "Multipoint Equalization with the Condition Number" IEEE 1996.*

* cited by examiner

*Primary Examiner* — Vivian Chin
*Assistant Examiner* — Fatimat O Olaniran
(74) *Attorney, Agent, or Firm* — Brooks Kushman P.C.

(57) ABSTRACT

A frequency equalization system is provided that substantially equalizes the room frequency responses generated by at least one loudspeaker within a listening area so that the frequency responses in the listening area are substantially constant and flat within a desired frequency range with minimum signal latency. The frequency equalization system may use multiple microphones to measure the audio signals of one or more subwoofers to achieve an improved bass response that is flat across the relevant frequency range. The system employs an algorithm that is a closed-form, non-iterative, mathematical solution and features short computation time with reduced delays.

24 Claims, 24 Drawing Sheets

REDUCED LATENCY LOW FREQUENCY EQUALIZATION SYSTEM

CROSS REFERENCE TO RELATED APPLICATION(S)

This application is a continuation-in-part of, and claims priority to, U.S. Utility patent application Ser. No. 11/026,773, filed on Dec. 30, 2004, titled EQUALIZATION SYSTEM TO IMPROVE THE QUALITY OF BASS SOUNDS WITHIN A LISTENING AREA, by inventors Ashish Aggarwal, Ulrich Horbach and Todd Welti, the entire application of which is incorporated by reference into this application, and claims priority to Provisional Patent Application Ser. No. 60/782,544, filed on Mar. 14, 2006, titled MULTI-CHANNEL, LOW LATENCY, MULTIPLE POSITION LOW FREQUENCY EQUALIZATION IN ROOMS, by inventors Ulrich Horbach, Adam Strauss and Pedro Manrique, the entire application of which is incorporated by reference into this application.

BACKGROUND

1. Field of the Invention

This invention relates generally to improving the quality of sound generated by one or more low-frequency loudspeakers in a listening area, and more particularly, to reduced latency design of digital filters.

2. Related Art

Sound systems typically include loudspeakers that transform electrical signals into acoustic signals. The loudspeakers may include one or more transducers that produce a range of acoustic signals, such as high, mid and low-frequency signals. An example of such a loudspeaker is a subwoofer that may include a low frequency transducer that typically produces low-frequency signals in the range of 20 Hz to 100 Hz.

Sound systems may generate the acoustic signals in a variety of listening environments, such as, home listening rooms, home theaters, movie theaters, concert halls, vehicle interiors, and recording studios, to name a few. Typically, a listening environment includes single or multiple listening positions for person or persons to hear the acoustic signals generated by the loudspeakers. The listening position may be a seated position, such as a section of a couch in a home theater environment, or a standing position, such as a spot where a conductor may stand in a concert hall.

The listening environment may affect the acoustic signals, including the low, mid and high frequency signals at the listening positions. Depending on the acoustic characteristics of the room, the position of the listener in a room and the position of the loudspeaker in the room, the loudness of the sound can vary for different frequencies. This may be especially true for low frequencies.

Low frequencies may be important to the enjoyment of music, movies, and other forms of audio entertainment. In the home theater example, the room boundaries, including the walls, draperies, furniture, furnishings, and the like, may affect the acoustic signals as they travel from the loudspeakers to the listening positions.

One approach to characterizing the room is by the impulse response of a loudspeaker received at a microphone placed within the listening area. The impulse response contains information about various properties of the acoustical signals including the amplitude and phase at a single frequency, a discrete number of frequencies, or a range of frequencies.

An amplitude response approach is a measurement of the loudness at the frequencies of interest. Generally, the amplitude is measured in decibels (dB). Amplitude deviations may be expressed as positive or negative decibel values in relation to a designated target value. The closer the amplitude values measured at a listening position are to the target values, the better the amplitude response. Deviations from the target reflect changes that occur in the acoustic signal as it interacts with room boundaries. Peaks represent a positive amplitude deviation from the target, while dips represent a negative amplitude deviation from the target.

Deviations in amplitude may depend on the frequency response of the acoustic signal reproduced at the subwoofer, the subwoofer location, and/or the listener position. A listener may not hear low frequencies as they were recorded on the recording medium, such as a soundtrack or compact disk, but instead as they are distorted by the room boundaries. Thus, the room can change the acoustic signal reproduced by the subwoofer and adversely affect the low-frequency performance of the sound system.

Many equalization techniques have been used in the past to reduce or remove amplitude deviations within a listening area. One such technique is spatial averaging, which calculates an average amplitude response for multiple listening positions, and then equally implements the equalization for all subwoofers in the system. Spatial averaging, however, only corrects for a single "average listening position" that does not exist in reality. Thus, when using spatial averaging techniques, some listening positions may have a better low-frequency performance than other positions, but certain locations may be negatively impacted. For instance, the spatial averaging may worsen the performance at some listening positions as compared to their un-equalized performance. Moreover, attempting to equalize and flatten the amplitude response for a single location potentially creates problems. While peaks may be reduced at the average listening position, attempting to amplify frequencies where dips occur requires significant additional acoustic output from the subwoofer, thus reducing the maximum acoustic output of the system and potentially creating large peaks in other areas of the room.

Another known equalization technique is to position multiple subwoofers in a "mode canceling" arrangement. By locating multiple loudspeakers symmetrically within the listening room, standing waves may be reduced by exploiting destructive and constructive interference. However, the symmetric "mode canceling" configuration assumes an idealized room. (i.e., dimensionally and acoustically symmetric) and does not account for actual room characteristics including variations in shape or furnishings. Moreover, the symmetric positioning of the loudspeakers may not be a realistic or desirable configuration for the particular room setting.

Still another equalization technique is to configure the audio system using mathematical analysis to reduce amplitude deviations. One such mathematical analysis simulates standing waves in a room based on room data. For example, room dimensions, such as length, width, and height of a room, are input and various algorithms predict where to locate a subwoofer based on data input. This mathematical method does not, however, account for the acoustical properties of a room's furniture, furnishings, composition, etc. For example, an interior wall having a masonry exterior may behave very differently in an acoustic sense than a wood framed wall. Further, this mathematical method cannot effectively compensate for partially enclosed rooms and may become computationally onerous if the room is not rectangular.

Another method to equalize the frequency responses in a room attempts to reduce variations across seats by optimizing a limited set of parameters such as gain, delay and a set of low order filter parameters for each transducer using trial and error. However, the accuracy of that method is more by chance because of the guessing involved in determining those parameters. As such, to obtain an accurate equalization solution, it takes a tremendous amount of computational power for a full search. Moreover, the method does not in general yield optimum results because of the limited complexity of the applied filters, which is necessary to limit the processing time.

Accordingly, a need exists for a system that is able to accurately determine a configuration for an audio system such that the audio performance for one or more listening positions in a given space is improved with minimum latency.

SUMMARY

A reduced latency low frequency equalization system is provided. The low frequency equalization system utilizes one or more microphones to measure the impulse responses of a listening area within a room at various locations. These measurements are then used to filter the audio signals sent to the subwoofers in the room. The filtered audio signals improve the bass responses by producing substantially flat frequency responses at the microphone measurement points within the desired listening area, across a relevant frequency range.

In particular, impulse responses measured in the desired listening area may be used to calculate coefficients in order to design a filter for each corresponding subwoofer so that the frequency responses are substantially flat within the listing area, across a relevant frequency range. In general, the inverses of the frequency responses are determined to remove the coloration added by the room. The inverse frequency responses may be smoothed so that sudden gains in excess of the allowable gains that a subwoofer may handle may be minimized or removed. An improvement in overall delay time may be achieved by using group delay equalization techniques. A target function of the inverse frequency response may be applied so that the equalization is applied to a desired frequency range in which the subwoofer optimally operates. The modified inverse response may then be used to determine the filter coefficient for each audio signal of the subwoofers. A processor, such as a digital signal processor (DSP), may be used to filter the audio signal based on the filter coefficients.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
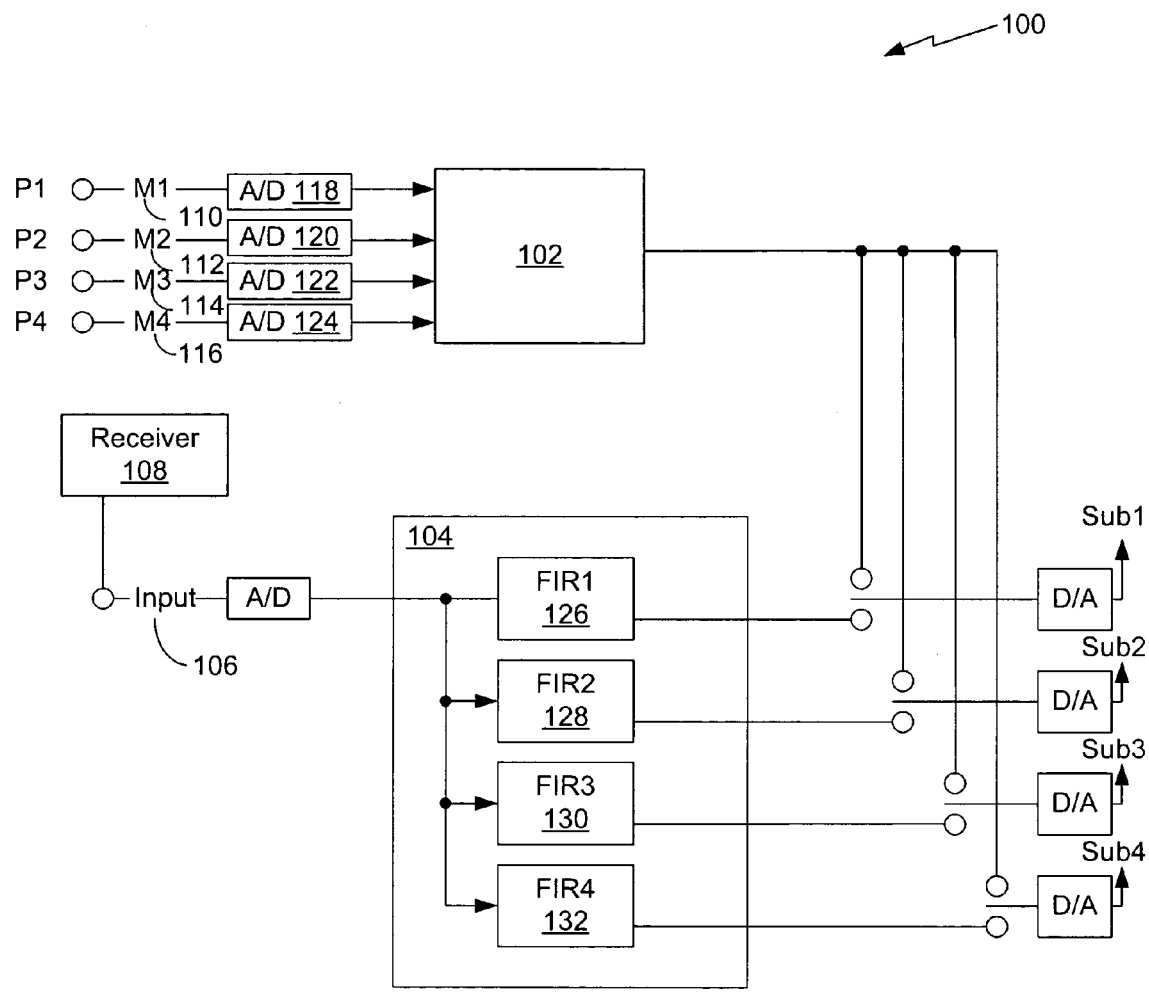
FIG. 1 is a block diagram representation of one example of one implementation of an equalization system.

FIG. 1 is a block diagram of one example of one implementation of an equalization system 100. The equalization system 100 is able to improve bass response from one or more subwoofers positioned within a room such that the bass response within a desired listening area of the room is relatively flat across a predetermined low-frequency range. The equalization system 100 may be used to equalize frequency responses from in a variety of rooms having unique characteristics.

Figure 2:
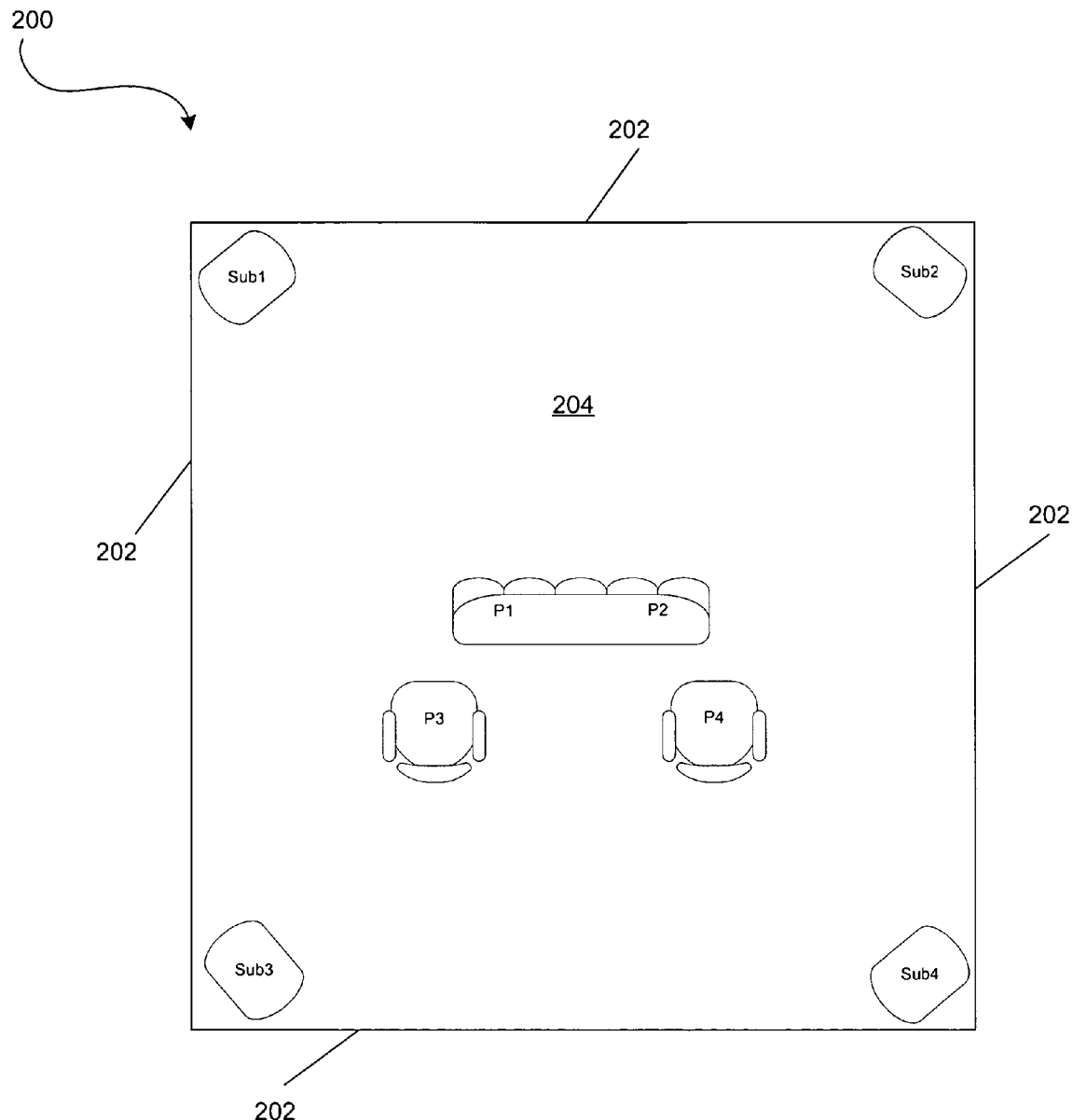
FIG. 2 illustrates one example of a listening environment in which the equalization system of FIG. 1 may be utilized.

FIG. 2 illustrates one example of a listening environment in which the equalization system 100 of FIG. 1 may be employed. While the equalization system 100 may be used to equalize bass response in a variety of rooms of various types, sizes and shapes, for purposes of illustration, the equalization system 100 may be utilized in a rectangular room 200 having four walls 202, a floor 204 and a ceiling (not shown). Subwoofers Sub1, Sub2, Sub2, and Sub4 may be positioned such that one subwoofer is in each corner of the room. Further, the room may have seating positions for four people identified as P1, P2, P3, and P4.

As illustrated in FIG. 1, to adjust the bass response of the subwoofers Sub1, Sub2, Sub2, and Sub4, each of the seating positions may have an associated microphone M1 110, M2 112, M3 114, and M4 116. A receiver 108 provides the input signal 106 to digital processor 104 which may be coupled to four subwoofers Sub1, Sub2, Sub3, and Sub4 located in the corners of the rectangular room 200 of FIG. 2. Alternatively, the equalization system may utilize only one microphone that may be moved among the seating positions P1, P2, P3, and P4 to equalize the system and adjust bass response.

As further illustrated in FIG. 1, the equalization system 100 may include a preprocessor 102 that is capable of generating test signals and determining the coefficients for each filter FIR1 126, FIR2 128, FIR3 130, and FIR4 132 corresponding respectively to each of the subwoofers Sub1, Sub2, Sub3, and Sub4. The filters FIR1 126, FIR2 128, FIR3 130, and FIR4 132 may be located in a processor 104. As illustrated, the equalization system 100 may utilize Finite Impulse Response (FIR) filters.

The preprocessor 102 may contain a signal generator that may send output signals, one at a time, to each of the subwoofers Sub1, Sub2, Sub3, and Sub4 to measure the impulse response of that subwoofer at each of the microphones M1 110, M2 112, M3 114, and M4 116. For example, the signal generator may output a logarithmic frequency sweep for a predetermined amount of time to each of the subwoofers Sub1, Sub2, Sub3, and Sub4 sequentially. The logarithmic frequency sweep allows the signal generator to send out a signal covering a broad frequency spectrum through the subwoofers. As an example, the output signal may be sent out for approximately four seconds.

With each of the subwoofers Sub1, Sub2, Sub3, and Sub4 sequentially sending the output signal over a period of time, the microphones M1 110, M2 112, M3 114, and M4 116 located at the listing positions P1, P2, P3, and P4 within the room 200 may measure the signal responses independently or simultaneously. For instance, the signal generator 102 may send an output signal through subwoofer Sub1, so that the microphones M1 110, M2 112, M3 114, and M4 116 may measure the impulse response of the room 200 from the signals generated at the location of Subwoofer Sub1 within the room 200. The signal generator 102 may then send another output signal through the subwoofer Sub2, so that the microphones M1 110, M2 112, M3 114, and M4 116 may measure the impulse response of the room due to the output signal source generated from the location of Subwoofer Sub2 within the room 200. Similarly, Subwoofer Sub3 and Sub4 may each, independently, send the output signal for the microphones M1 110, M2 112, M3 114, and M4 116 to measure the impulse response of the room 200 due to the output of each respective Subwoofer Sub3 and Sub4. The microphones M1 110, M2 112, M3 114, and M4 116 may convert the acoustic signals into electrical signals. Before the electrical signals are provided to the preprocessor 102, the electrical signals may be digitized at the predetermined rate using A/D converters, such as A/D converters 118, 120, 122, and 124.

Through the microphones M1 110, M2 112, M3 114, and M4 116, the preprocessor 102 may capture a predetermined number of impulse response samples per second for each combination of subwoofer Sub1, Sub2, Sub3, and Sub4 and microphone M1 110, M2 112, M3 114, and M4 116. The captured impulse response may be down-sampled to yield N samples for each measured impulse response. With four subwoofers (Sub1, Sub2, Sub3, and Sub4) and four microphones (M1 110, M2 112, M3 114, and M4 116), this results in a set of sixteen impulse responses where each set has N numbers of samples. For example, the preprocessor 102 may capture N=2048 samples at a sampling rate of 750 samples per second. In other implementations, different numbers of subwoofers, microphones, and samples may be used along with a different sampling rate.

The preprocessor 102 receives the measured sweep signal responses of the room from the microphones M1 110, M2 112, M3 114, and M4 116. The preprocessor 102 then calculates the filter coefficients for use by the FIR filters FIR1 126, FIR2 128, FIR3 130, and FIR4 132. The preprocessor 102 is coupled to and in signal communication with a processor 104 that implements the filters FIR1 126, FIR2 128, FIR3 130, and FIR4 by modifying each of the audio signals sent to the corresponding subwoofers Sub1, Sub2, Sub3, and Sub4 to substantially equalize the in-room frequency responses for the sound generated by the subwoofers Sub1, Sub2, Sub3, and Sub4.

As further illustrated in the FIG. 1, the system may receive an input audio signal 106 from a receiver 108. The processor 104 may filter the input audio signal 106 with the four FIR filters 126, 128, 130, and 132 resulting in four audio signal outputs (one for each subwoofer). The input audio signal 106 is shown as originating with a receiver 108, but in practice any type of audio or audio-visual device may generate the input audio signal 106, for example TVs, DVD players, VCRs, DVRs, stereos, amplifiers and turntables, to name a few. Further, the processor 104 may be a variety of processors, such as a DSP or microprocessor. Further, the filters may be a filter type other than a FIR filter. Additionally, the different modules and/or components of FIG. 1 may be implemented in one or more semiconductor packages, e.g., chips.

Figure 3:
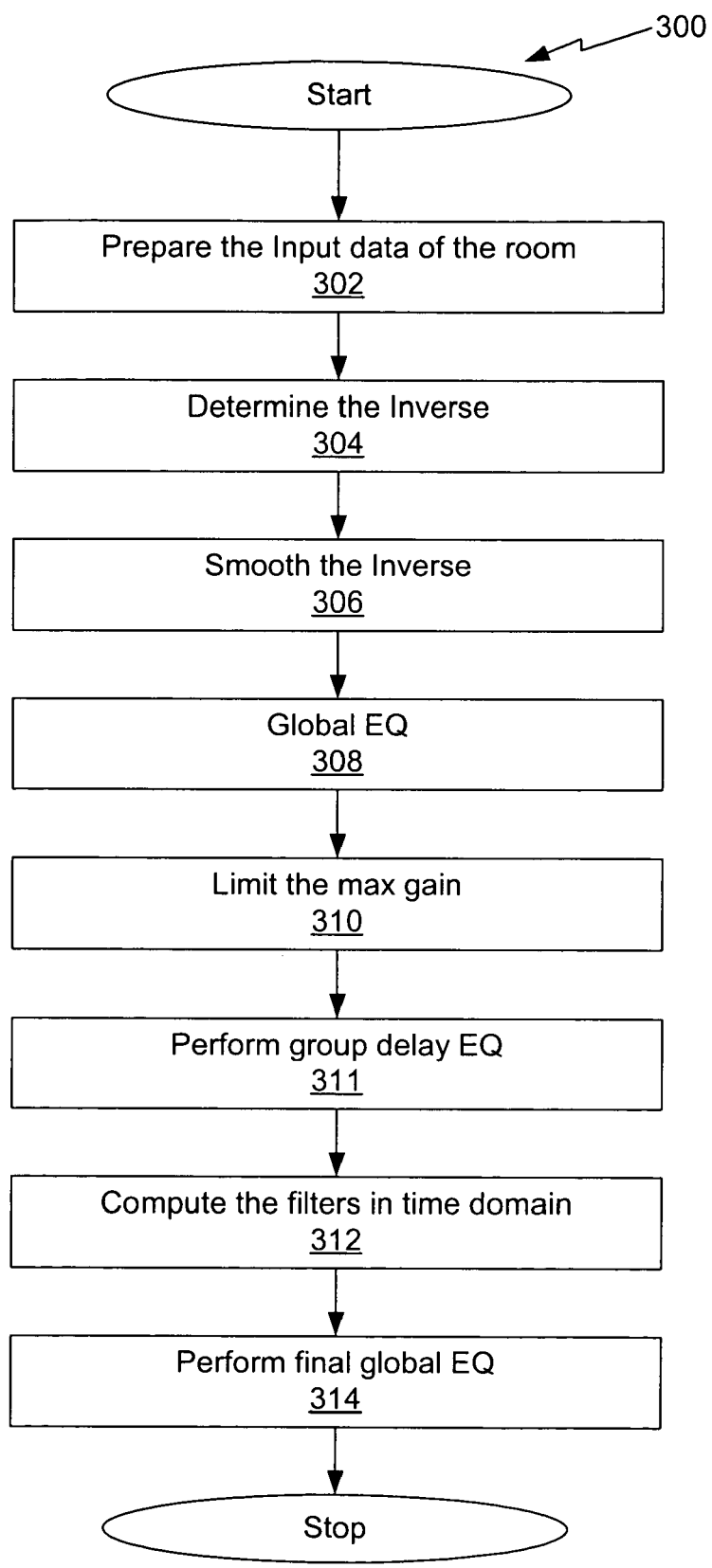
FIG. 3 is a flow diagram with an overview of the design method for the filters FIR1 . . . FIR4 for one example of the equalization system of FIG. 1.

FIG. 3 is a flow diagram 300 of an overview of one example of the filter design method as implemented in preprocessor 102 of the equalization system 100 of FIG. 1. For purposes of illustrations, the following discussion regarding the steps utilized by the equalization system will explain the operation of the equalization system 100 utilizing four subwoofers $n_{sub}=4$ and for microphones $n_{mic}=4$, within the listening environment, as depicted in FIG. 2. Those skilled in the art will, however recognize that the equalization system 100 may be utilized with any combination of subwoofers and microphones in a listening environment. Regardless of the number of subwoofers and microphone in a listening environment, the audio signal sent to one or more subwoofers may be filtered in accordance with the example method outlined in FIG. 3 and in accordance with the following description.

The flow diagram 300 starts with step 302 where the input data may be prepared to substantially equalize the frequency responses of the room. Preparing the input data 302 generally includes computing the impulse responses of the room and transforming the impulse response into the frequency domain. The step of preparing the input data 302 will be described in further detail in FIG. 4. Once the impulse responses are transformed into their frequency domain, in step 304, an inverse of the frequency response matrix may be determined. The resulting inverse frequency responses may be utilized to, in effect, undo the coloration added by the walls of a room. In other words, filtering each of the audio signals with its respective inverse filter frequency response and sending the filtered signals to their respective subwoofers may produce ideal frequency responses. The inverse filters, however, may have local sudden peaks and dips where such sudden gains may exceed the allowable gains that a subwoofer may handle. As such, in step 306, the local peaks and dips in the inverse filter frequency response may be smoothed using a complex smoothing method. This provides approximate inverses for the frequency responses of the room.

In step 308, global equalization may occur, which is accomplished by globally equalizing the result after approximate inverse filtering so that a target function describing transitions at the low and high frequency band edges may be approximated. Global equalization may also use a smoothing method that addresses peaks and dips separately. As subwoofers generally operate below 100 Hz, in block 310, a limit may be placed on the gain that may be applied to the subwoofer outside of the desired low-frequency range to protect the subwoofer, such as below 20 Hz and/or above 100 Hz.

In step 311, while still in the frequency domain, group delay equalization may occur with respect to a global minimum that replaces filters by their minimum-phase versions outside of their pass-band. In addition, a decreasing Butterworth type group delay response may be superimposed. In step 312, the inverse of the obtained equalization filters is then used to determine the filter coefficients to process each of the audio signals. In block 314, a final global equalization filter is determined to improve the overall result after time domain processing.

Figures 4, 5:
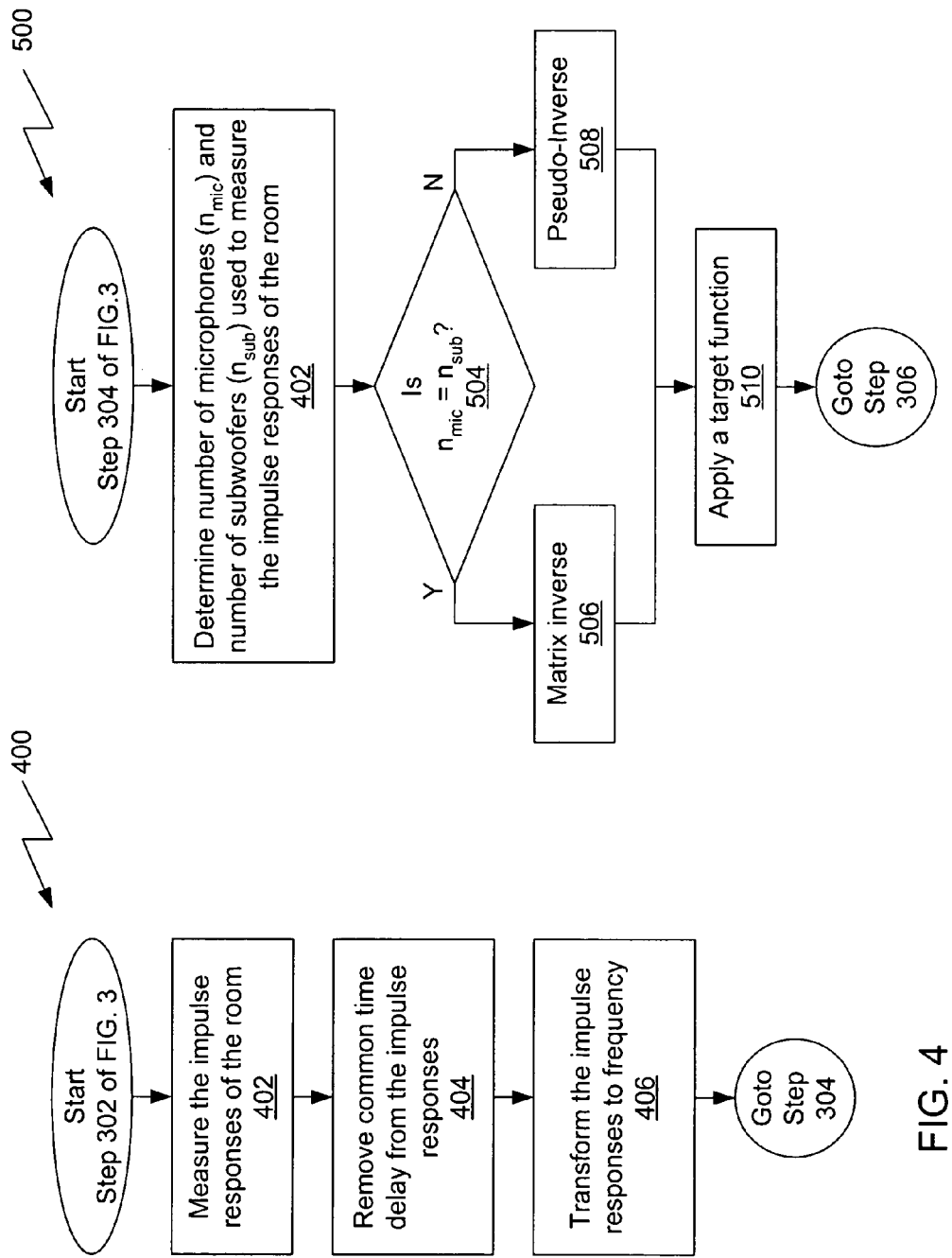
FIG. 4 is a flow diagram showing further details of the steps for preparing the input data, as illustrated in step 302 of FIG. 3.
FIG. 5 is a flow diagram showing further details of the steps for determining the inversion for the frequency response, as illustrated in step 304 of FIG. 3.

FIG. 4 is a flow diagram 400 showing further details of the steps for preparing the input data, as illustrated in step 302 of FIG. 3. As illustrated in FIG. 4, to prepare the input data, the impulse responses of the room are determined in step 402. Once the impulse responses have been measured 402, any common time delay from the impulse responses may be removed, as set forth in step 404. Removing common time delay is done to allow the solvability of the mathematical problem of complex smoothing. For instance, with regard to the output signal sent by subwoofer Sub1, the microphone M1, positioned at P1, may be closest to Sub1. As such, the microphone M1 will receive the output signal from Sub1 before the other microphones M2, M3 and M4, positioned at P2, P3 and P4 respectively. The time it takes for the output signal from Sub1 to reach the microphone M1 is common to the other microphones M2, M3 and M4. This time may be defined as a common time delay with regard to the impulse measured by the four microphones M1-M4 for the output signal sent by the subwoofer Sub1. Likewise, a corresponding common time delay may be measured for output signals sent by each of the other subwoofers Sub2-Sub4. For instance, a common time delay for the output signal sent by the Sub3 is the time it takes for the output signal from the Sub3 to reach its closest microphone. The minimum delay of all the measured impulse responses is the common time delay. The common time delay may be offset or deducted from all the impulse responses measured by the four microphones M1-M4.

In step 406, the input data of the time domain impulse responses of the room may be transformed into frequency domain using, for example, Fast Fourier Transform ("FFT"). For example, with four microphones M1-M4 and four subwoofers Sub1-Sub4, a set of sixteen impulse responses may be measured where each set has N number of samples. Each impulse response is transformed into the frequency domain using FFT. In this example, an N point FFT is employed that yields N complex values for each measured impulse response. As such the resulting set of $[n_{min} \times n_{sub}] \times N$ complex FFT points are represented as N number of $n_{mic} \times n_{sub}$ matrices Ai, where i=1 . . . N. At each i or frequency point, the FFT provides amplitude and phase.

FIG. 5 is a flow diagram 500 showing further details of the steps for determining the inversion for the frequency response, as illustrated in step 304 of FIG. 3. The flow diagram starts at step 502 by determining the number of microphones $n_{mic}$ used to measure the impulse responses and the number of subwoofers $n_{sub}$ in the room. A decision is then made at step 504, if $n_{mic}=n_{sub}$, then in step 506, an exact matrix inversion method may be used to find the exact inverse of the impulse responses. Otherwise, if $n_{mic}>n_{sub}$, then in step 508, a pseudo-inverse method may be used to find the inverse of the impulse responses. With the impulse responses transformed into the frequency domain (see step 406 of FIG. 4), the inverse matrices may be calculated for each of the frequency points to determine the ideal equalization at that frequency point. In this regard, N number of inverse matrices $B_i$, where i=1 . . . N, may be determined. This results in N complex-value matrices $B_i$, such that $A_i B_i = 1$.

In the case that $n_{mic}>n_{sub}$, the method of pseudo-inverse, step 508, may be used to calculate $B_i$. The well-known method of pseudo-inverse minimizes the mean squared error between the desired and actual result. Expressed mathematically, $B_i$ is computed such that $(1-A_i B_i)^* \times (1-A_i B_i)$ is minimized where * denotes a complex-conjugate operation.

In step 510, once the inverse matrices have been determined, a target function may be chosen for each frequency point for each of the microphone positions M1 through M4. The target function is the desired frequency response at each listening position. The target function may be a complex-value vector containing $n_{mic}$ elements $T_i$ (i=1 . . . N). In this example, with four microphones M1-M4, $T_i$ contains four complex-valued elements per frequency point. A simple example of target $T_i$ is a unity vector. The vectors $F_i$ that describes $n_{sub}$ filters at a particular frequency point i (i=1 . . . N) are then computed as matrix multiplication $F_i = B_i T_i$. The vectors $F_i$ describe filters at a particular frequency point i (i=1 . . . N) that would perform an exact inverse (ideal equalization). The vectors $F_i$ in effect undo the coloration added by the walls of the room so that multiplying $A_i F_i = A_i B_i T_i = T_i$ results in an idealized equation.

Figure 6:
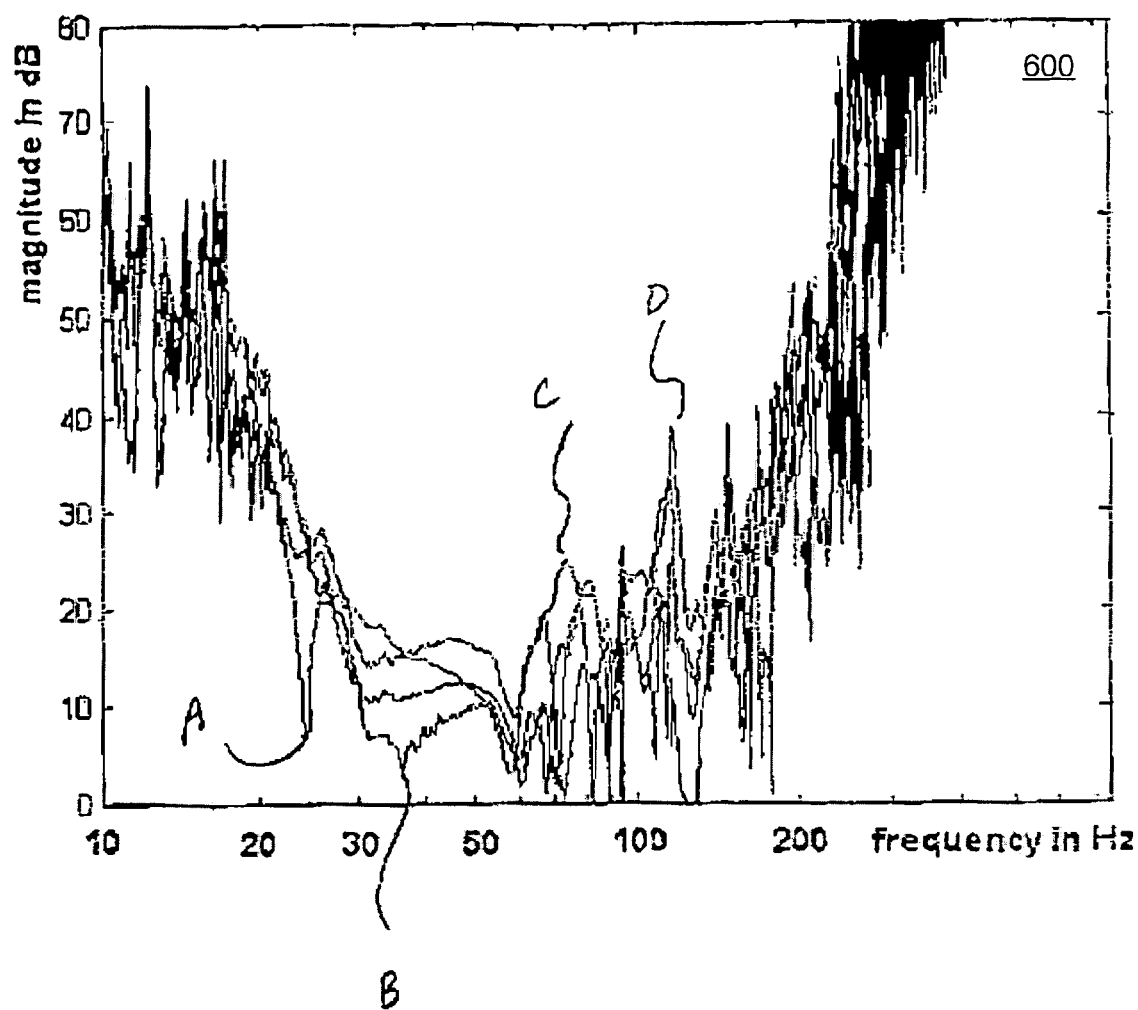
FIG. 6 illustrates the curves F(1), F(2), F(3), and F(4) representing the inverse frequency responses as obtained after matrix inversion (step 304 in FIG. 3).

FIG. 6 illustrates a plot 600 of the curves F(1), F(2), F(3), and F(4) representing the inverse frequency responses as obtained after the matrix inversion (step 304 in FIG. 3). The curves represent the logarithmic magnitude of the filters F(k) (k=1 . . . $n_{sub}$=4) as obtained after the matrix inversion. The target function used in this example may be a unity vector $T_i = [1,1,1,1]$, i=1 . . . N. The frequency axis f is f=(1 . . . N/2)_/N*fa, where N is FFT length and fa=750 Hz is the sampling frequency.

As can be seen in the plot 600, there are sudden peaks and dips as indicated by markings A, B, C, D, for example. Directly applying the filters F(k) to the output signals sent to the Sub1-Sub4 to equalize the frequency responses within the room may damage the subwoofers because the peaks at certain frequencies require applying significant gains at those frequencies that may be too high for the subwoofers to handle. In other words, the vector F(k) may impose gains at certain frequencies that may exceed the maximum amount of gain that the subwoofers can handle.

Smoothing throughout the whole frequency range may be done to limit the length of the resulting filter in the time domain, which is known to converge to zero more rapidly after smoothing. The following is further discussion of smoothing the inverse of the matrices represented by the step 306 of FIG. 3. With the sudden peaks and dips in the frequency response vectors F(k), the ideal equalization may not be directly applied to the output signal sent to the subwoofers. The peaks and dips in the vectors F(k), however, may be minimized by smoothing the complex-value vectors F(k) across frequency. Methods for smoothing of complex-value vectors F(k) across a frequency is know in the art. For example, smoothing may be accomplished through the method described in an article titled "Generalized Fractional-Octave Smoothing of Audio and Acoustic Responses," by Panagiotis D. Hatziantoniou and John N. Mouijopoulos, published April of 2000, J. Audio Eng. Soc., Vol. 48, No. 4, pp. 259-280. In particular, smoothing of the complex-valued vectors F(k) may be carried out by computing the mean values separately for the real and imaginary parts, along a sliding frequency-dependent window, resulting in Fs(k). For example, a smoothing index q between 1.0 and 2.0 may be used, where $i*(q-1/q)$ denotes the width of the frequency-dependent sliding window, where i is the frequency index. Sliding windows such as Hanning or Welch window may be used. Note that it may be useful to perform smoothing in two or more separate frequency bands by using a different value for each frequency band. At higher frequencies, fluctuations across space and frequency in a room are usually larger, so that a higher q index may be utilized. Since the subwoofer operates mainly below 80 Hz, a high accuracy of the inversion filter above that frequency may not be necessary or even desirable because it may not apply to the whole listening area consistently, due to rapid fluctuations.

Figure 7:
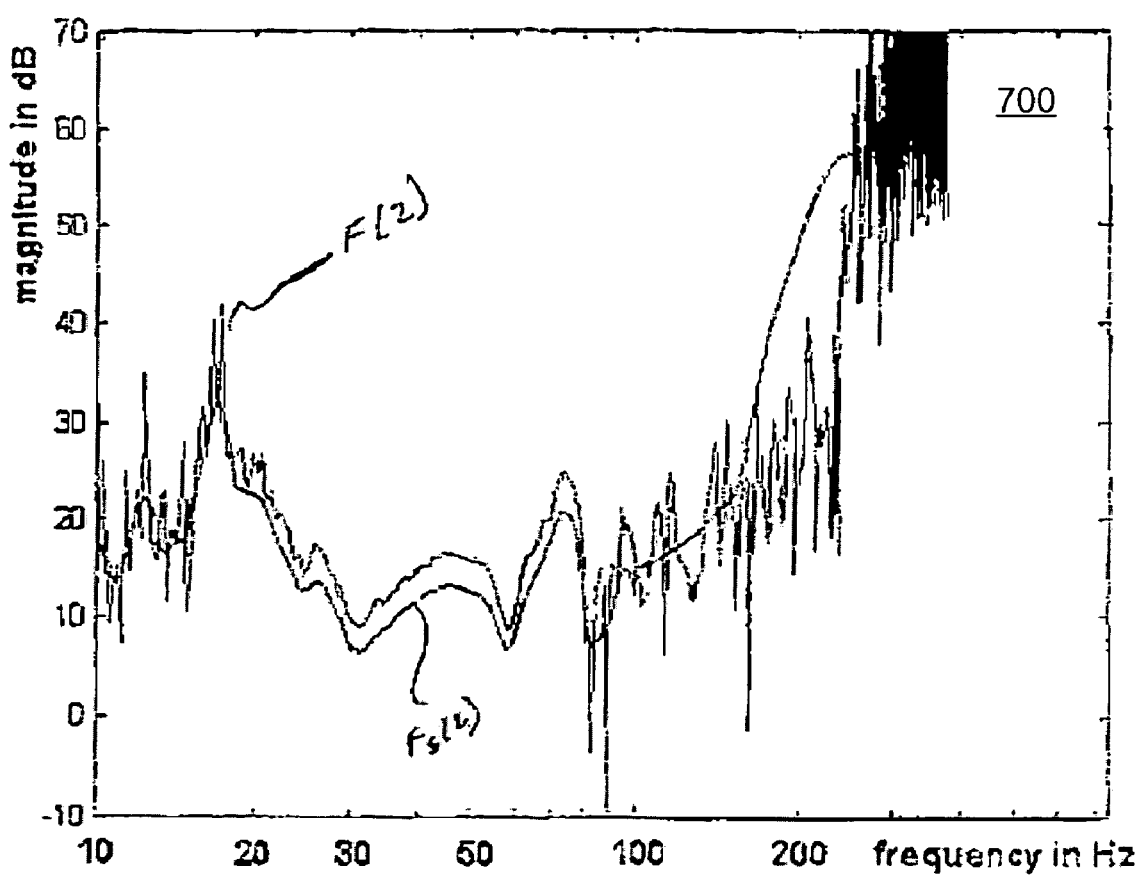
FIG. 7 is an example of filter F(2) and the smoothed version Fs(2).

Turning to FIG. 7, a plot of curve F(2) and the smoothed curved Fs(2) is shown. Curve F(2) may be smoothed in accordance with the method described above. The magnitude of the unsmoothed spectrum of the filter F(2) that may be applied to the output signal sent to the subwoofer Sub2, and curve Fs(2) represents the smoothed version of filter F(2). Note that in curve Fs(2), the local peaks and dips are smoother than in curve F(2) such that much of the sudden peaks and dips present in curve F(2) are more gradual in curve Fs(2). As such, curve Fs(2) is an approximation of the complex-valued filter F(2) so that equalization may be applied to the output signal to the subwoofer Sub2 without the local excessive gain. Likewise, in FIG. 8, an illustration 800 of four curves Fs(1), Fs(2), Fs(3), and Fs(4) is provided that represents the smooth version of the curves F(1), F(2), F(3), and F(4) in FIG. 6 is shown.

Figure 8:
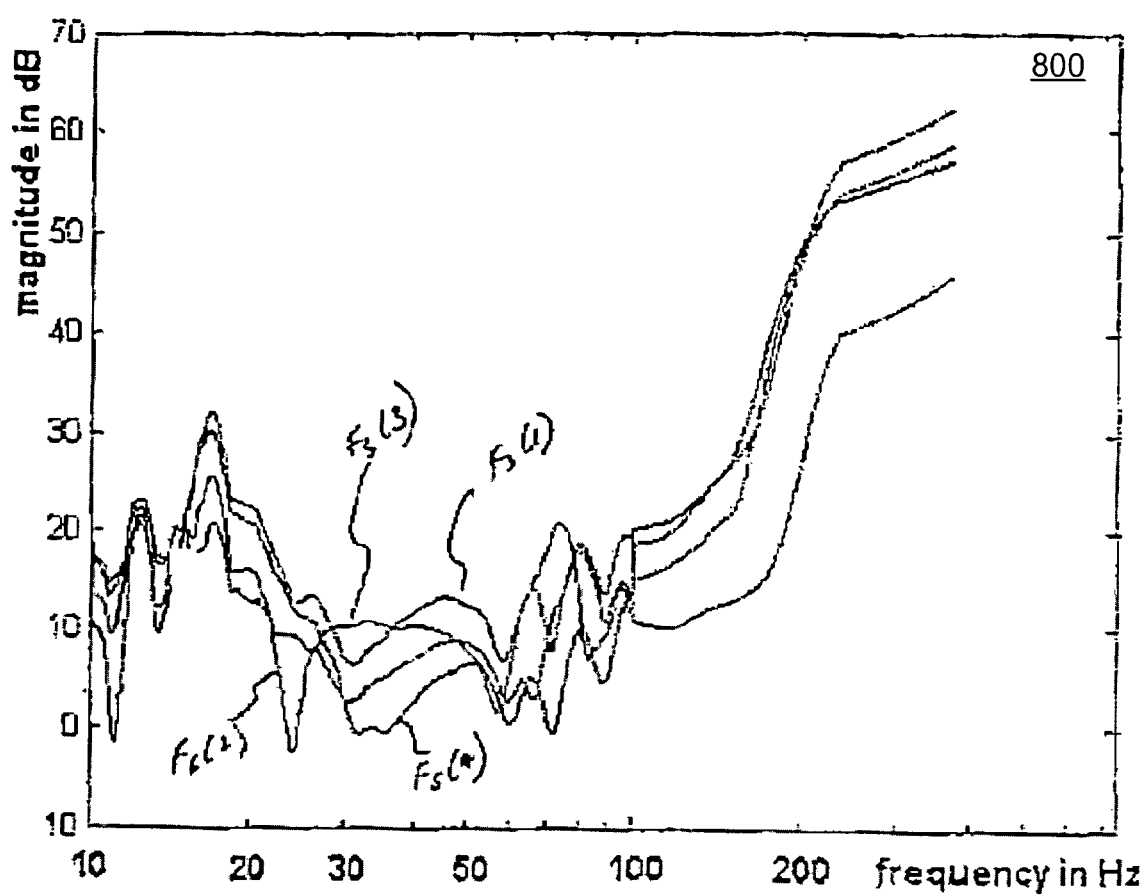
FIG. 8 illustrates four curves Fs(1), Fs(2), Fs(3), and Fs(4) representing smoothed versions of the filter curves F(1), F(2), F(3), and F(4) illustrated in FIG. 6.
Figure 9:
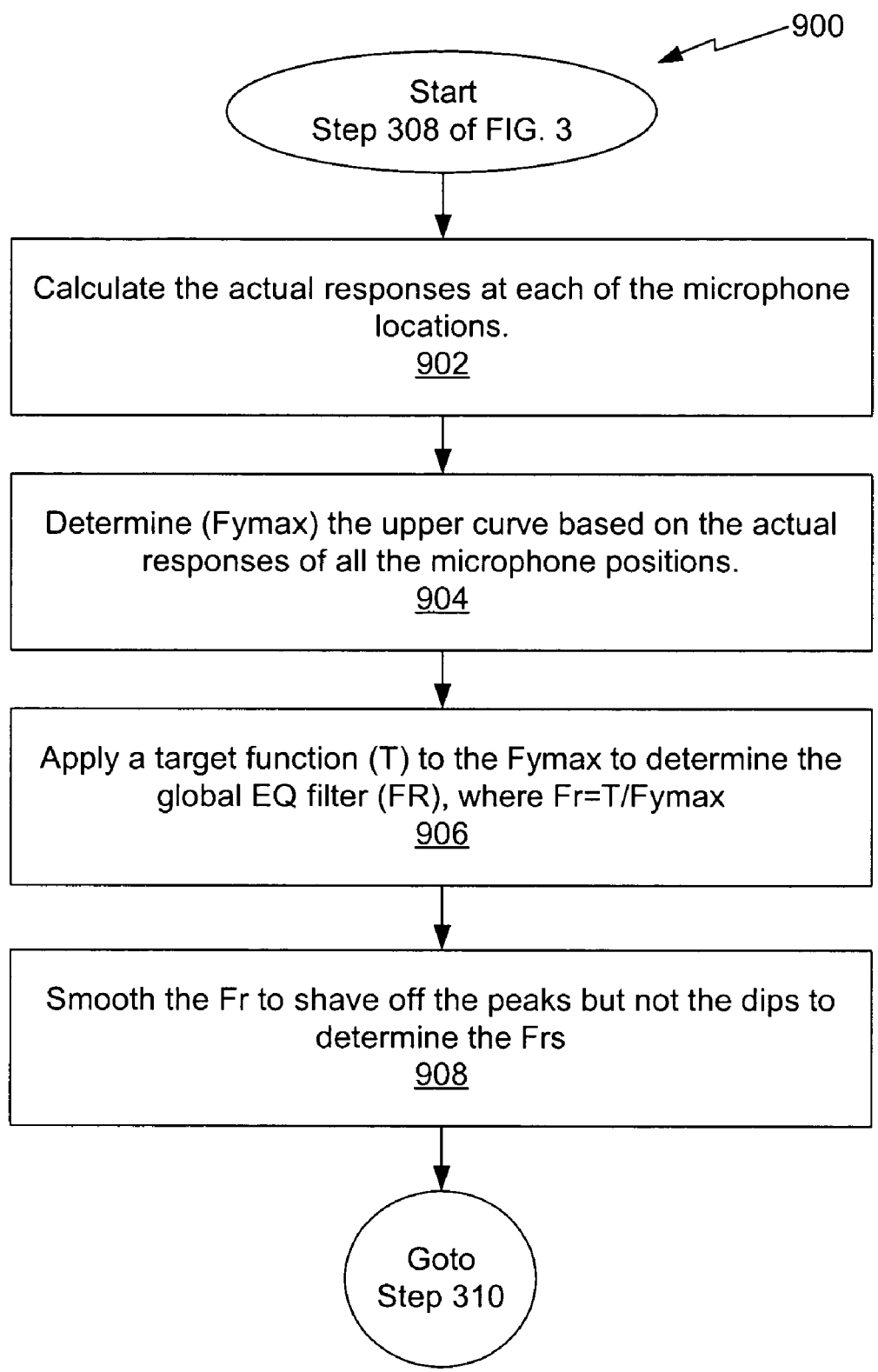
FIG. 9 is a flow diagram showing further details of determining the global equalization step 308 in FIG. 3.

In FIG. 9, a flow diagram 900 is shown that further details the steps of determining the global equalization in step 308 of FIG. 3. The complex smoothing of each of the complex-valued filters F(1) through F(4), as illustrated in FIG. 8 above, removes the local fluctuations of peaks and dips but the extreme gains may be still present. For example, subwoofers are generally designed to handle a maximum gain of about 15 dB to about 20 db at certain frequencies, with respect to the average gain. In FIG. 7, gains of greater than 30 dB below 20 Hz and 60 dB above 100 Hz occur. The subwoofers typically may not handle such extreme gains.

To manage the gains, a global equalization (EQ) may be performed. One way of calculating the global EQ is through the method described in the flow diagram 900 of FIG. 9. In step 902, the actual responses at each of the microphones positions or seats (listening positions) $Fy(j)(j=1 \ldots n_{seat})$ may be calculated by multiplying the original matrix A with Fs, as calculated in the above smoothing method. In other words, Fy=A*Fs. In step 904, an upper curve $Fy_{max}$ may be determined by taking the maximum magnitudes $Max\{Fy(1 \ldots n_{seat})\}$ for each of the frequency points. As such, all of the responses at the seats are below the curve $Fy_{max}$.

Figure 10:
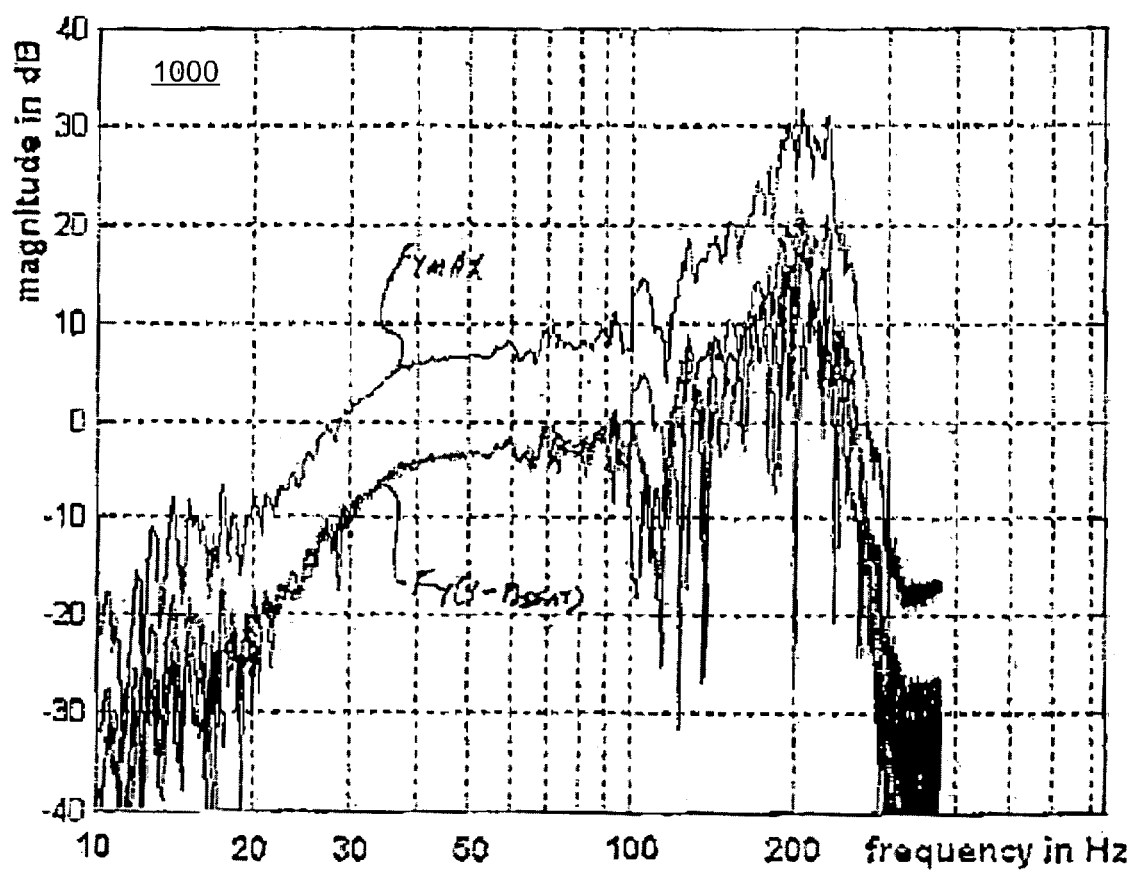
FIG. 10 shows in the lower graph that the frequency responses at the four microphones positions P1, P2, P3, and P4, after filtering in accordance with the filters, Fs(1), Fs(2), Fs(3), and Fs(4) of FIG. 8, and the upper graph shows the upper limit of the curves, raised by 10 dB.

In FIG. 10, the lower graph shows the frequency responses at the four microphones positions P1, P2, P3, and P4, after the filtering in accordance with the filters, Fs(1), Fs(2), Fs(3), and Fs(4) of FIG. 8, and the upper graph shows the upper limit of the curves, raised by 10 dB. The curve $Fy_{max}$ is raised by 10 dB to better show the $Fy_{max}$ curve. This means that no response is greater than the curve $Fy_{max}$ along any frequency point.

The curve $Fy_{max}$ denotes the maximum magnitudes in dB within the whole frequency range of 0 Hz to half the sample rate. Subwoofers, however, are designed to operate optimally in a more limited range than the above frequency range. As such, in step 906 of FIG. 9, the upper curve $Fy_{max}$ may be limited within a predetermined frequency range that would allow the subwoofers to operate at their optimal frequency range. In this regard, a global EQ filter Fr may be computed to operate in the predetermined frequency range by dividing a target function T by $Fy_{max}$ or $Fr=T/FY_{max}$. The target function T is real-valued having magnitude frequency responses of high pass and low pass filters that characterize the frequency range where the respective transducer (subwoofer) optimally works. Typical filters are Butterworth high pass filters of order n=2 . . . 4 (corner frequencies 20 . . . 40 Hz), and Butterworth low pass filters of order n=2 . . . 4 (corner frequencies 80 . . . 150 Hz).

Figure 11:
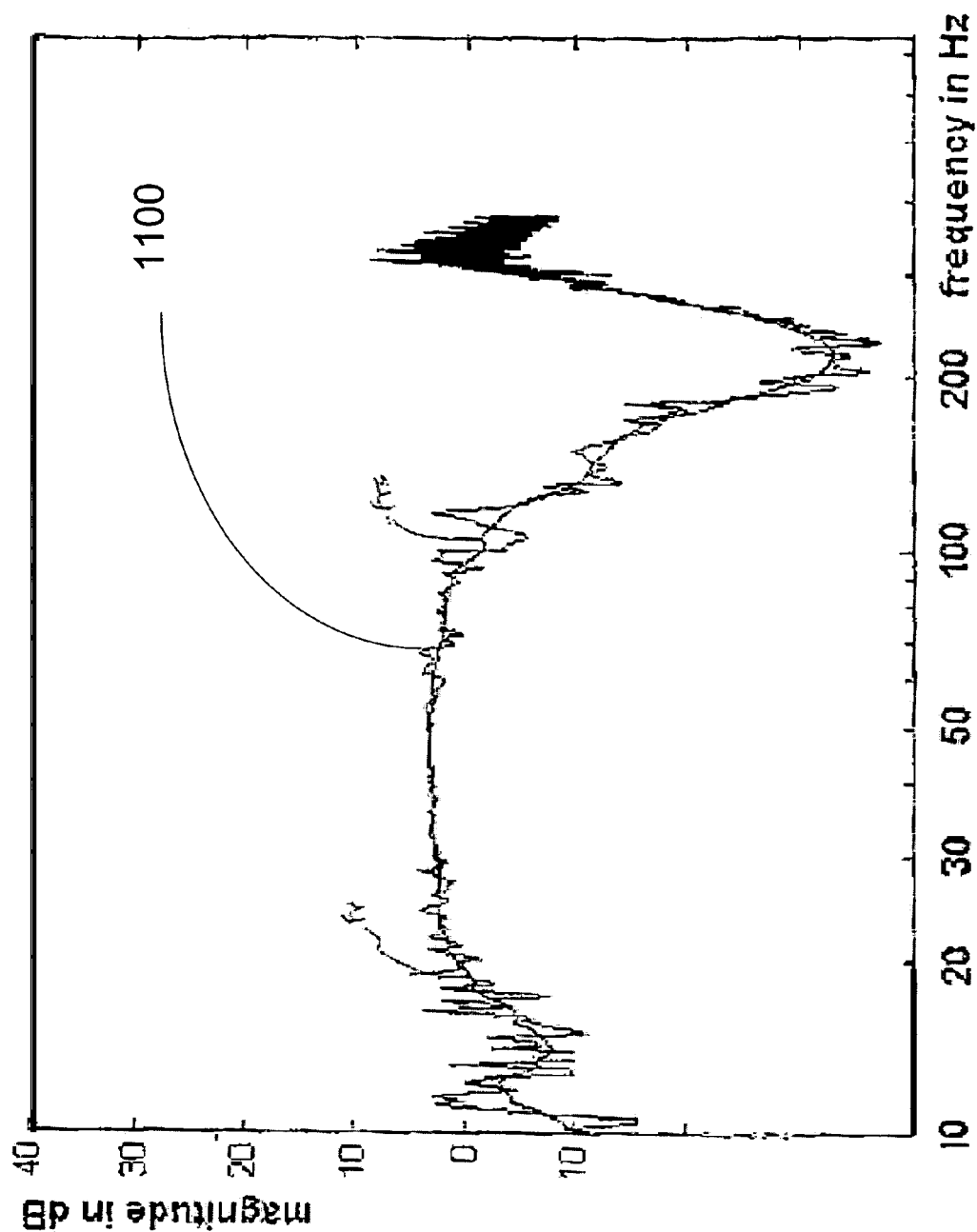
FIG. 11 is a plot of the global equalization filter and its smoothed version.

In FIG. 11, a plot 1100 of an application of the global equalization filter and its smoothed version is shown. The log-magnitude response of the global EQ filter Fr has peaks that may interfere with the quality of the sound. In this regard, in step 908 of FIG. 9, the curve Fr is smoothed to remove the peaks in the curve Fr. The smoothing method may be used to determine an intermediate response Frs that is the smoothed version of Fr. The peaks in Fr in essence may be "shaved off" by computing the difference between Frs and Fr, and rectifying the differences.

Figure 12:
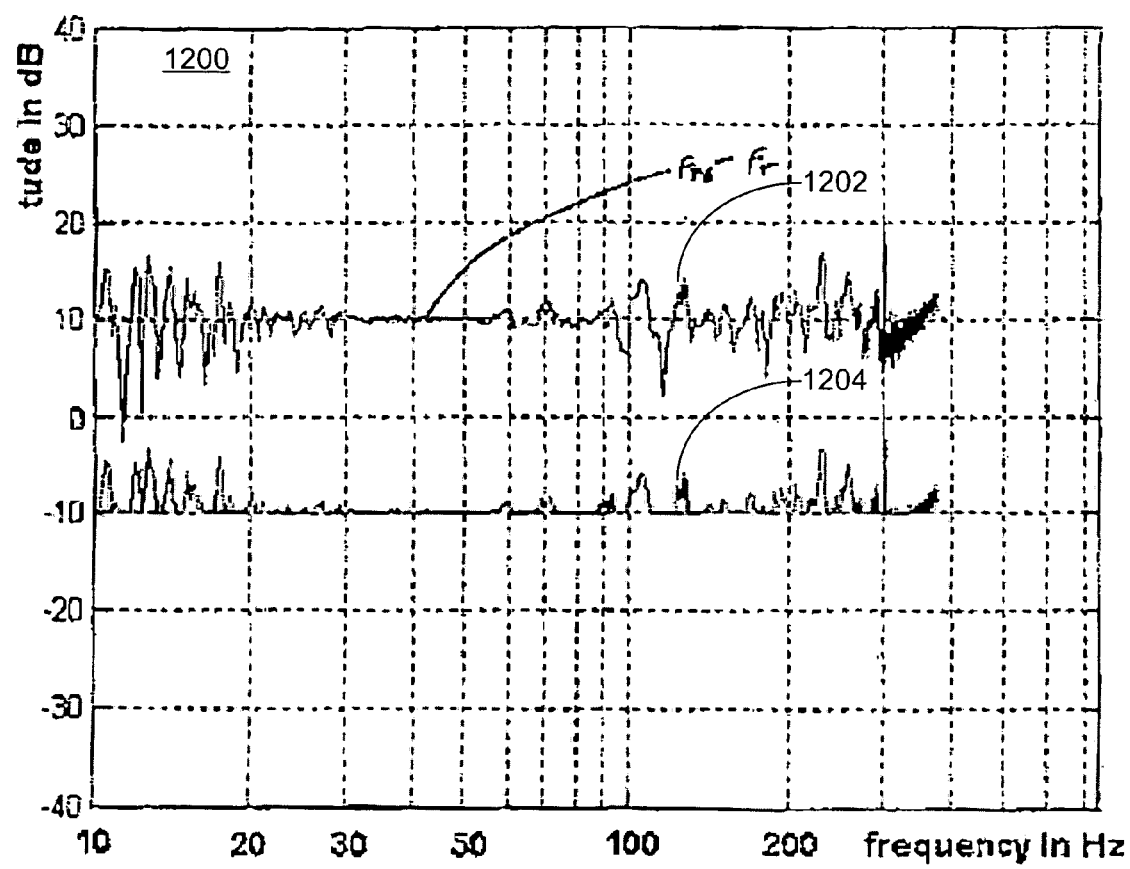
FIG. 12 is a diagram with the top curve representing the difference between smoothed and unsmoothed frequency responses of FIG. 10 (raised by 10 dB), and the lower curve representing the rectified difference (lowered by 10 dB).

In FIG. 12, a diagram 1200 with the top curve 1202 representing the difference between smoothed Frs and unsmoothed frequency responses Fs (raised by 10 dB) and lower curve 1204 representing the rectified difference (lowered by 10 dB) is shown.

Figure 13:
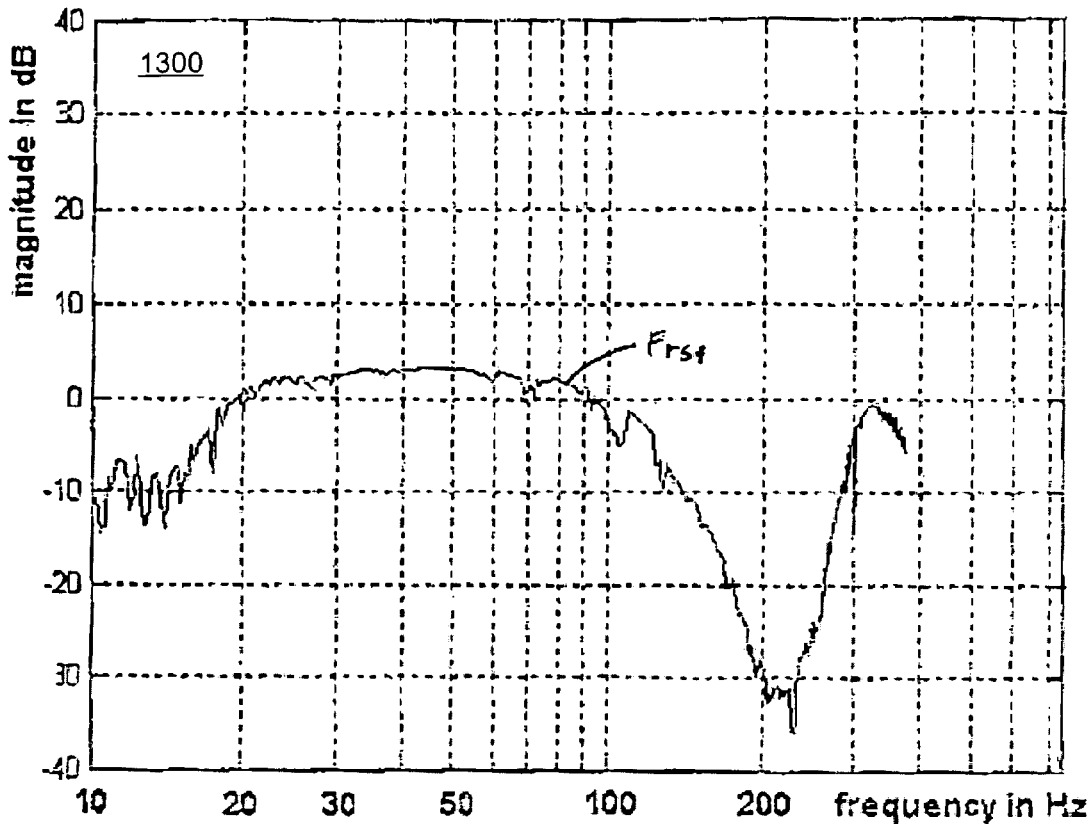
FIG. 13 illustrates the final frequency response of the global equalization filter.

Turning now to FIG. 13, an illustration 1300 of the frequency response of the global equalization filter is shown. The log-magnitude response of the global EQ filter Fr has peaks in the curve Fr that may be removed. A smoothing method, as described above, may be used to determine an intermediate response Frs that is the smoothed version of Fr. The peaks in Fr in essence may be "shaved off" by computing the difference between Frs and Fr, and rectifying the difference. Referring back to FIG. 12, the top curve 1202 represents the difference between Frs and Fr (raised by 10 dB), and the lower curve 1204 representing the rectified difference (lowered by 10 dB). Then, as shown in FIG. 13, the final frequency response of the global EQ filter Frsf 1300 may be obtained by subtracting the rectified difference from the original filter Fr that is the unsmoothed filter of FIG. 11. While the final Frsf 1300 shown in FIG. 13 shows dips, the number of peaks is reduced. The unwanted peaks would attempt to amplify frequencies where dips occur in the original response, requiring significant additional acoustic output from the subwoofer, thus reducing the maximum acoustic output of the system and potentially creating large peaks in other areas of the room.

Figure 14:
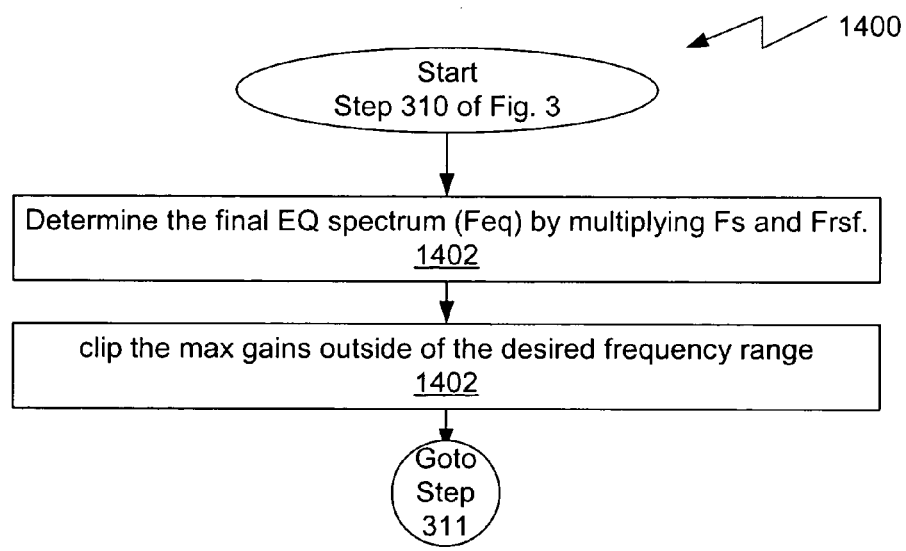
FIG. 14 is a flow diagram further detailing the step of limiting the maximum gains in the global equation filter step 310 of FIG. 3.

In FIG. 14, a flow diagram 1400 is provided that further details limiting the maximum gains in the global equation filter as shown in step 310 of FIG. 3. In block 1402, the final EQ spectrum Feq is computed by multiplying the complex spectra Fs of the individual EQ filters, as determined above, with the global, real-valued magnitude spectrum Frsf (as determined above), respectively.

Figure 15:
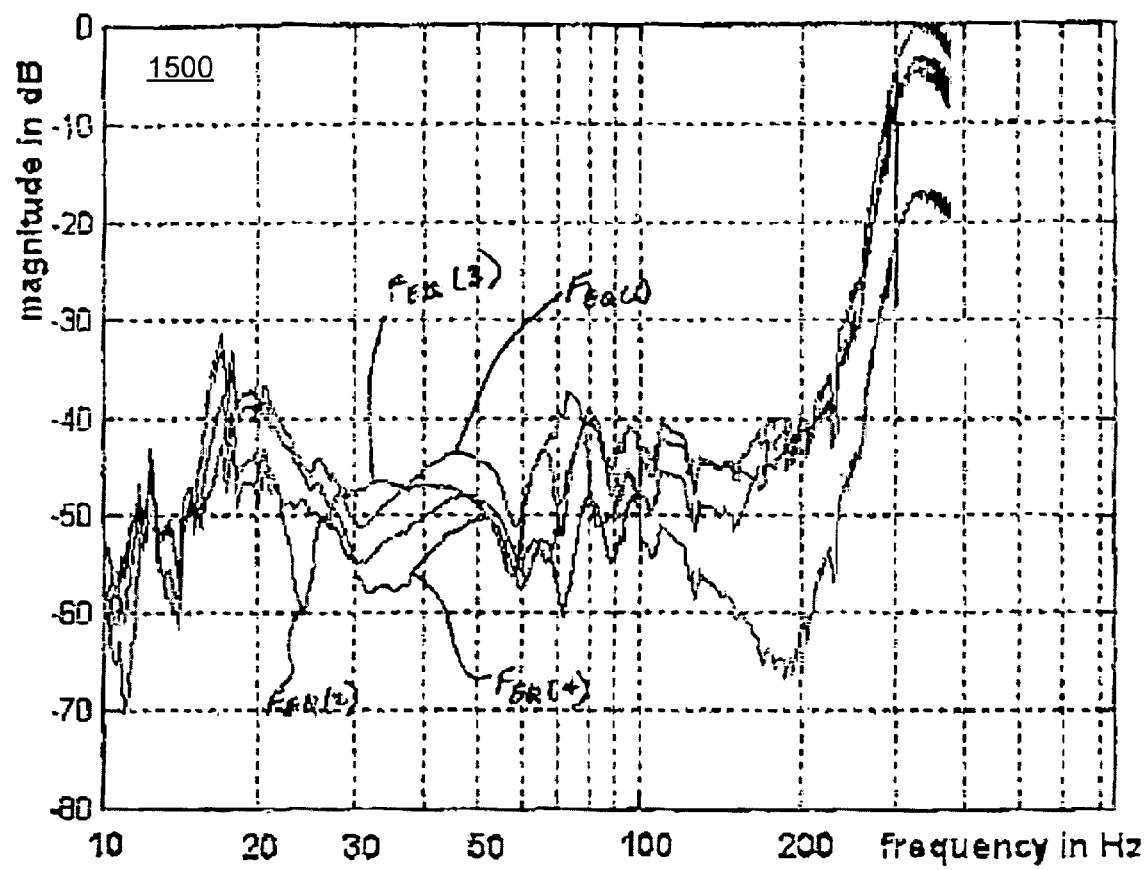
FIG. 15 illustrates the equalization filters for each of the subwoofers after complex smoothing of the curves Fs(1), Fs(2), Fs(3), and Fs(4) of FIG. 8 and applying the global equalization filter illustrated in FIG. 13.

FIG. 15 illustrates a graph 1500 of the frequency responses of the equalization filters Feq(1), Feq(2), Feq(3) and Feq(4) for each of the subwoofers after complex smoothing of the curves Fs(1), Fs(2), Fs(3), and Fs(4) of FIG. 8 (step 306 of FIG. 3) and application of the global equalization filter illustrated in FIG. 13. In FIG. 15, it can be seen that there are still substantial gains above 200 Hz and below about 20 Hz. This may be due to the chosen target function that is not sufficient to limit the final gains as desired. Therefore, in step 1404 of FIG. 14, limits may be placed on the gains below a predetermined low frequency and a predetermined high frequency. For example, a limit on the maximum gain may be applied by replacing the complex-valued Feq such that the maximum magnitude is clipped to "Maxgain" without altering the phase. Maxgain may be a value prescribed by the user that depends on the capabilities of the particular subwoofer. Preferably, different values of Maxgain may be applied in different frequency bands. The resulting filters may be scaled so that the maximum gain does not exceed one (0 dB).

Figure 16:
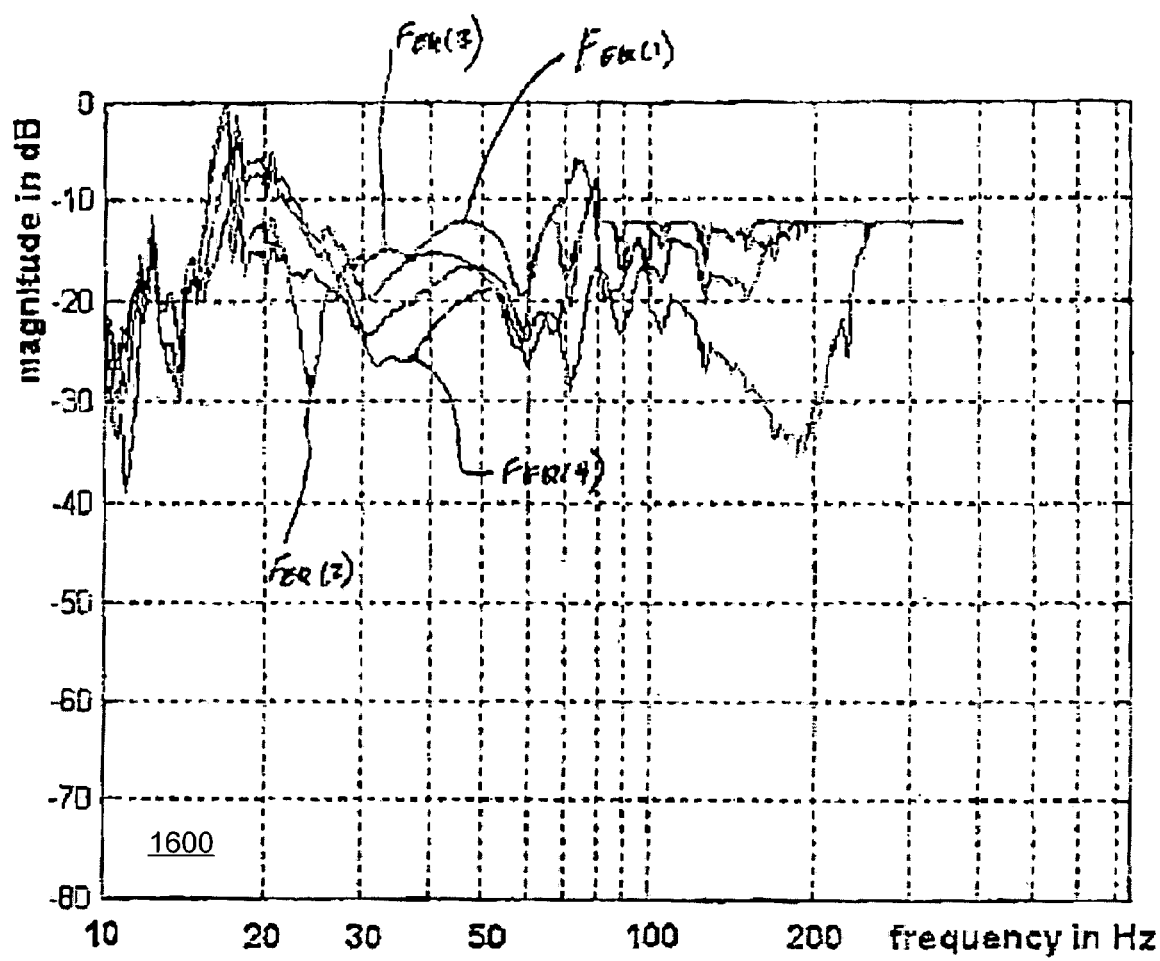
FIG. 16 shows the filter EQ spectra after applying Maxgain and normalization to 0 dB.

FIG. 16 shows graph 1600 of the filter EQ spectra after applying Maxgain and normalization to 0 dB. As illustrated, the EQ spectra may be normalized to 0 dB to maximize the average gain.

Figure 17:
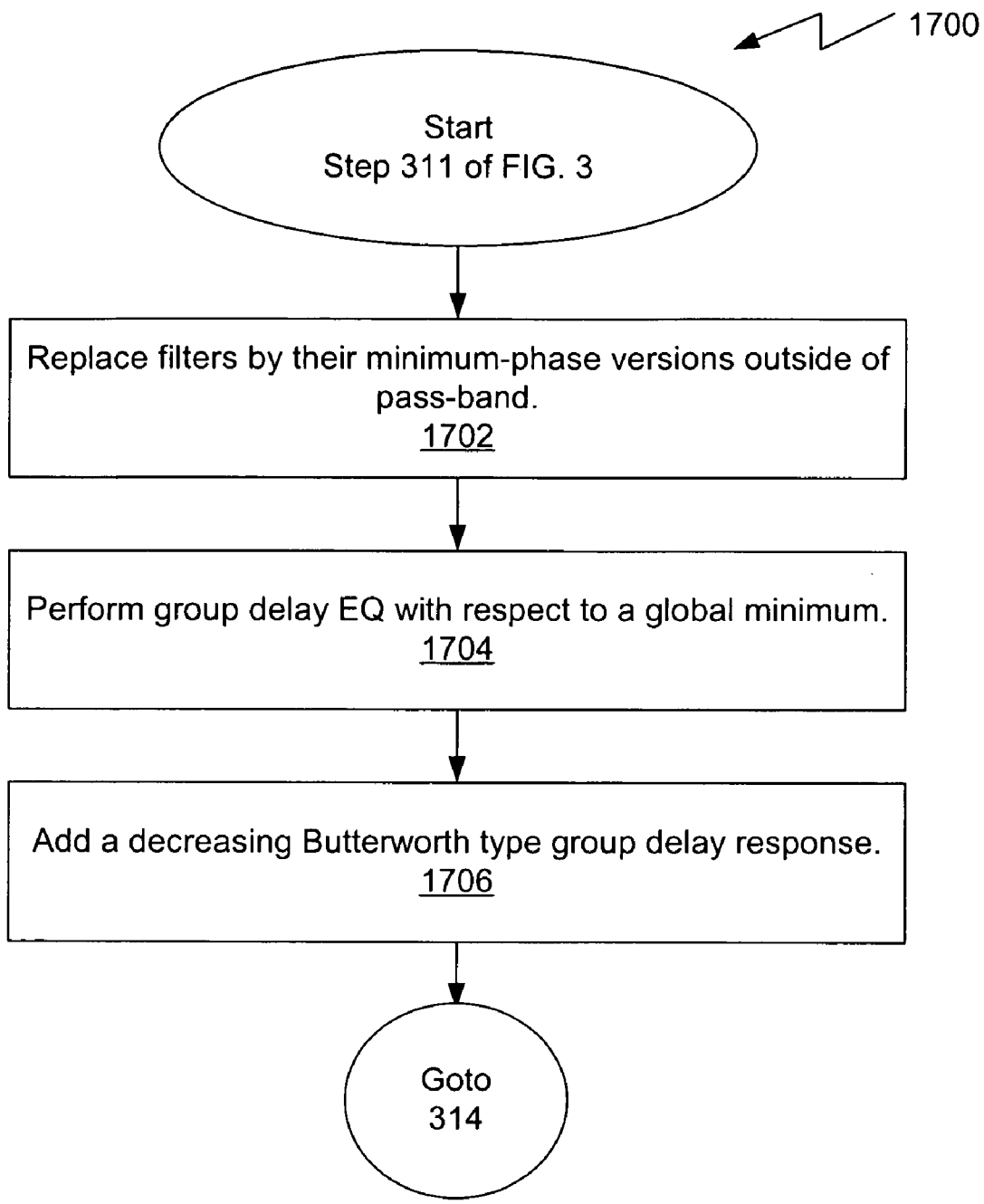
FIG. 17 is a flow diagram of the performance of the group delay equalization step 311 of FIG. 3.
Figure 18:
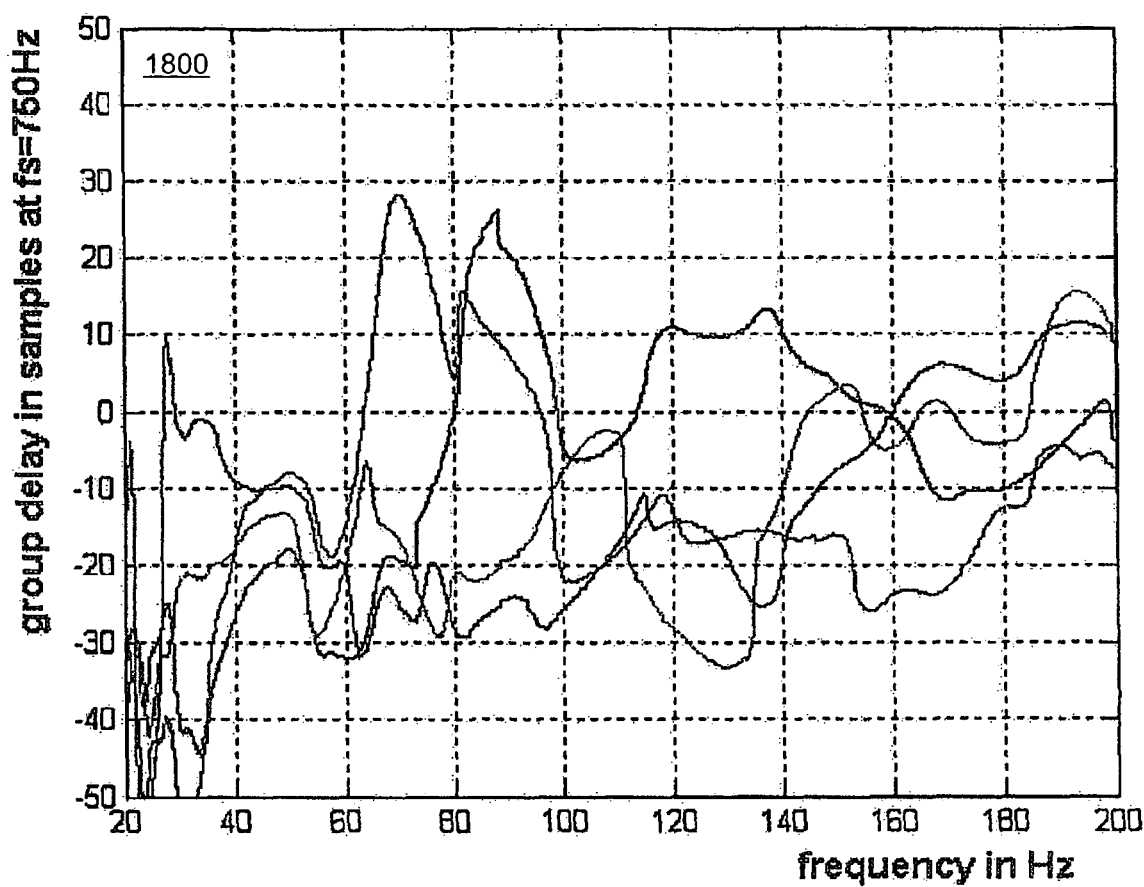
FIG. 18 is a graph for smoothed group delay responses of four EQ filters obtained after step 311 of FIG. 3.

In FIG. 17, a flow diagram 1700 of an example performance of the group delay equalization step 311 of FIG. 3 is illustrated. In step 1702, the filters are replaced by their minimum-phase versions outside of the pass band. Graph 1800 in FIG. 18 shows smoothed group delay responses of four EQ filters, as obtained after step 311 of FIG. 3. Since phase is only important in a limited band of interest, the pass band, which usually lies between 20 Hz and 80 Hz, frequency responses outside of those frequency points may be replaced with identical magnitudes but minimum phase, using methods such as Hilbert transform. The results of applying such a transform may be seen in the graph 1900 of FIG. 19.

Figure 19:
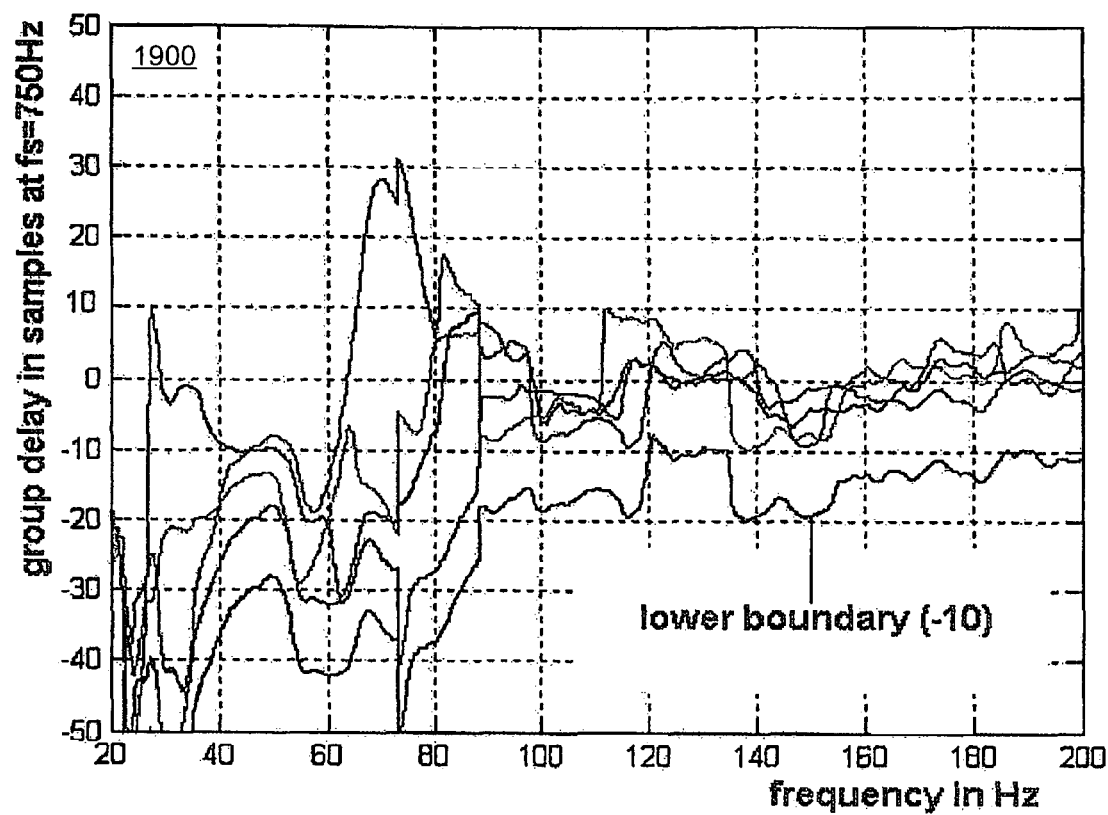
FIG. 19 is a graph of the group delay responses as obtained after step 1702 in FIG. 17, and their global minimum, shifted by 10 dB for better visibility.

In step 1704 of FIG. 17, the design of the group delay equalization (EQ) with respect to a global minimum is performed. To practically realize the filters as shown in FIG. 19, a constant delay would have to be added in the amount of the negative peak value of the group delay function. That value exceeds 50 samples in the shown example. This amount of latency would still be required for an equalized system featuring linear phase in the pass band. However, since flat magnitude response, not linear phase is required within the listening space, only the relative phase relations need to be preserved between the filters. An arbitrary EQ filter, applied to each of the channels equally, would not affect those phase relations (global EQ).

Figure 20:
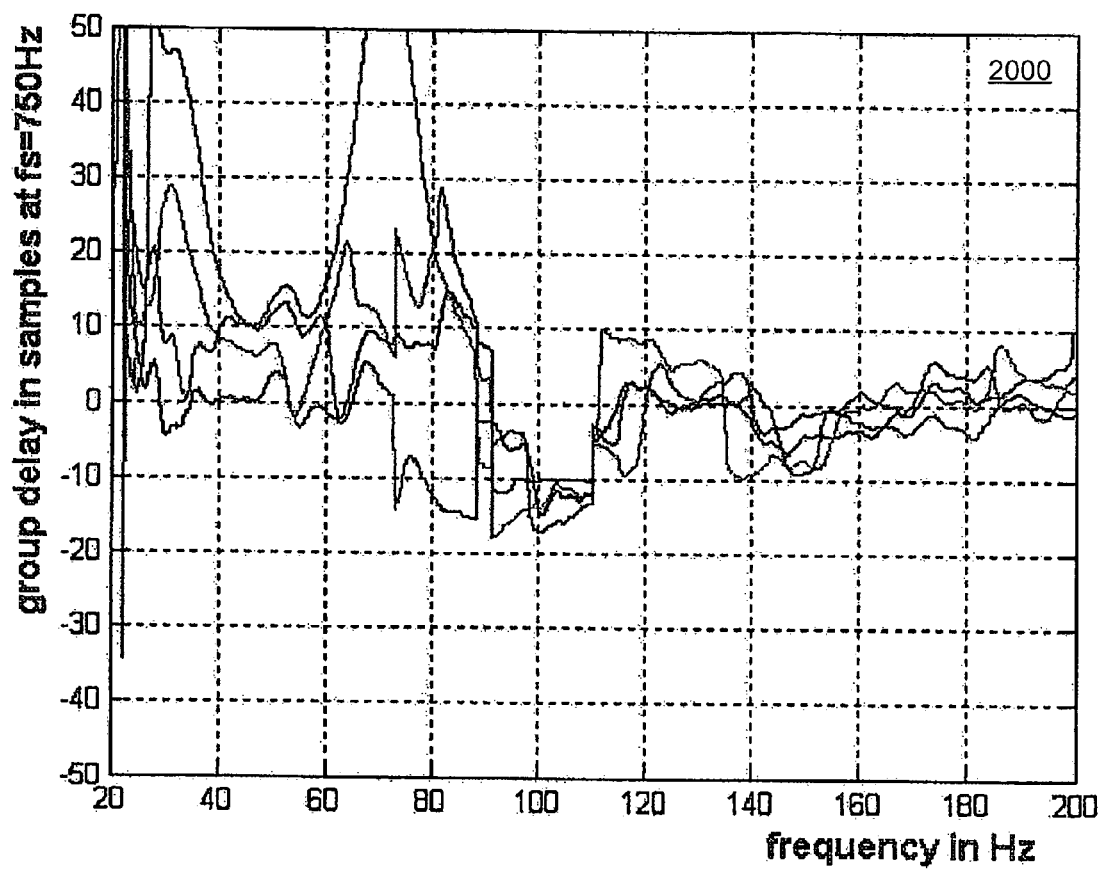
FIG. 20 is a graph of the applying the allpass filter globally after step 1704 of FIG. 17.

FIG. 19 illustrates the group delay responses as obtained after step 1702 in FIG. 17, and their global minimum, shifted by 10 dB for better visibility. The EQ filter may be an allpass with a group delay response equal to the inverse of that lower boundary curve. After applying that filter globally, the graph 2000 of FIG. 20 results. This approach may be understood as a normalization of the EQ filters with respect to their group delay, such that frequency-dependent, absolute values are minimized, whereas relative group delay values are preserved.

Figure 21:
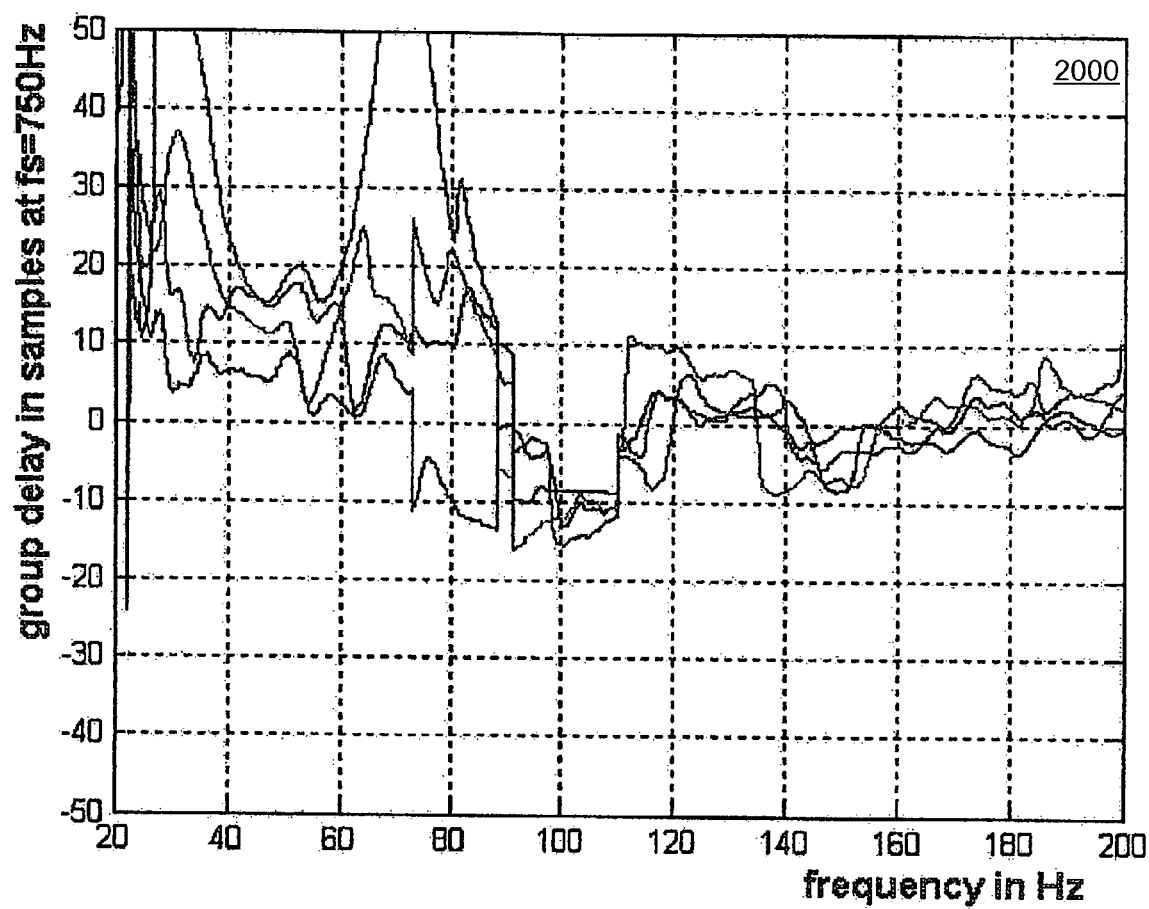
FIG. 21 shows typical filter group delay responses as obtained after step 1706 of FIG. 17.

In step 1706 of FIG. 17, a decreasing Butterworth type group delay response is added. Subwoofers may be designed to be typically maximum-flat, Butterworth-type forth or sixth order high pass systems with a correspondingly rising group delay response towards low frequencies. In step 1706, such a response is added as an additional global EQ allpass filter. The main purpose is to gain some safety margin between the lowest group delay value and zero to minimize the amount of constant delay that is still required to achieve causality. This step results in additional latency reduction in most cases, but not necessarily all cases. A typical filter group delay response as obtained after step 1706 is shown in the graph 2100 of FIG. 21.

Figure 22:
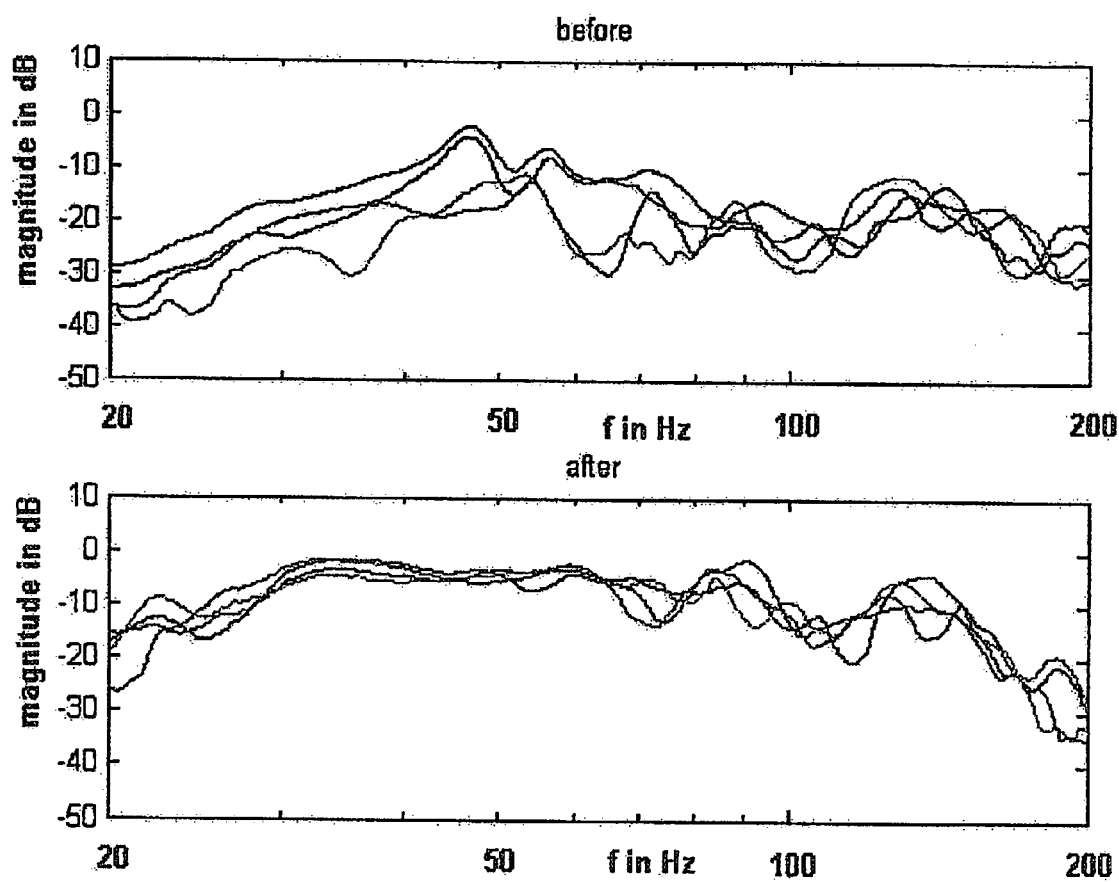
FIG. 22 shows the original, measured frequency responses at four locations, and the resulting equalized responses, as obtained after step 312 in FIG. 3.

Turning to FIG. 22, the original, measured frequency responses at four locations, and the resulting equalized responses, as obtained after step 312 in FIG. 3 is shown. The described approach still introduces magnitude errors in step 312 of FIG. 3, where the filters are shifted and windowed in the time domain. The main reason for this is that the smoothed group delay responses are being worked with, while discarding fine details. To improve the overall result, an additional global EQ filter is introduced in step 314 of FIG. 3, which is similar to the one described in step 308 of FIG. 3.

Figure 23:
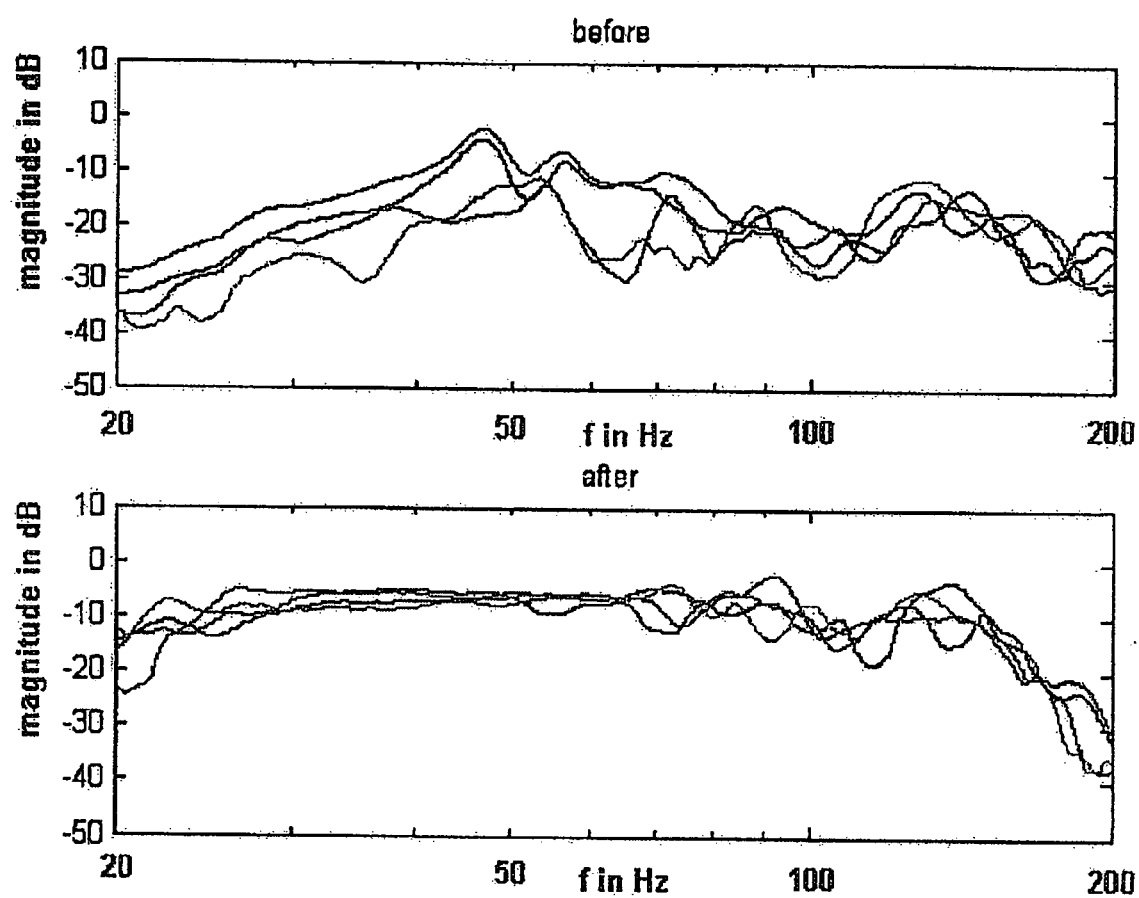
FIG. 23 depicts the final result after performing the final global EQ in block 314 of FIG. 3.
Figure 24:
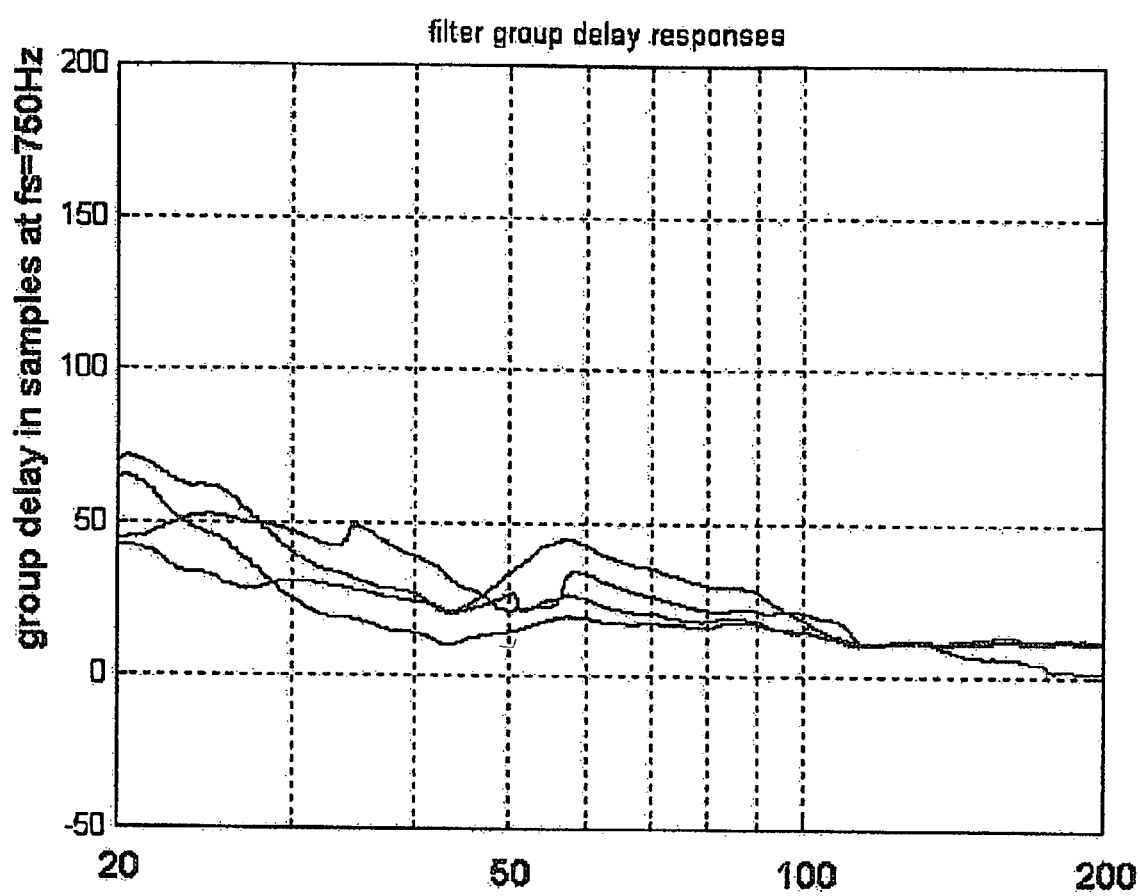
FIG. 24 shows the group delay responses of the EQ filters of step 314 of FIG. 3.
Figure 25:
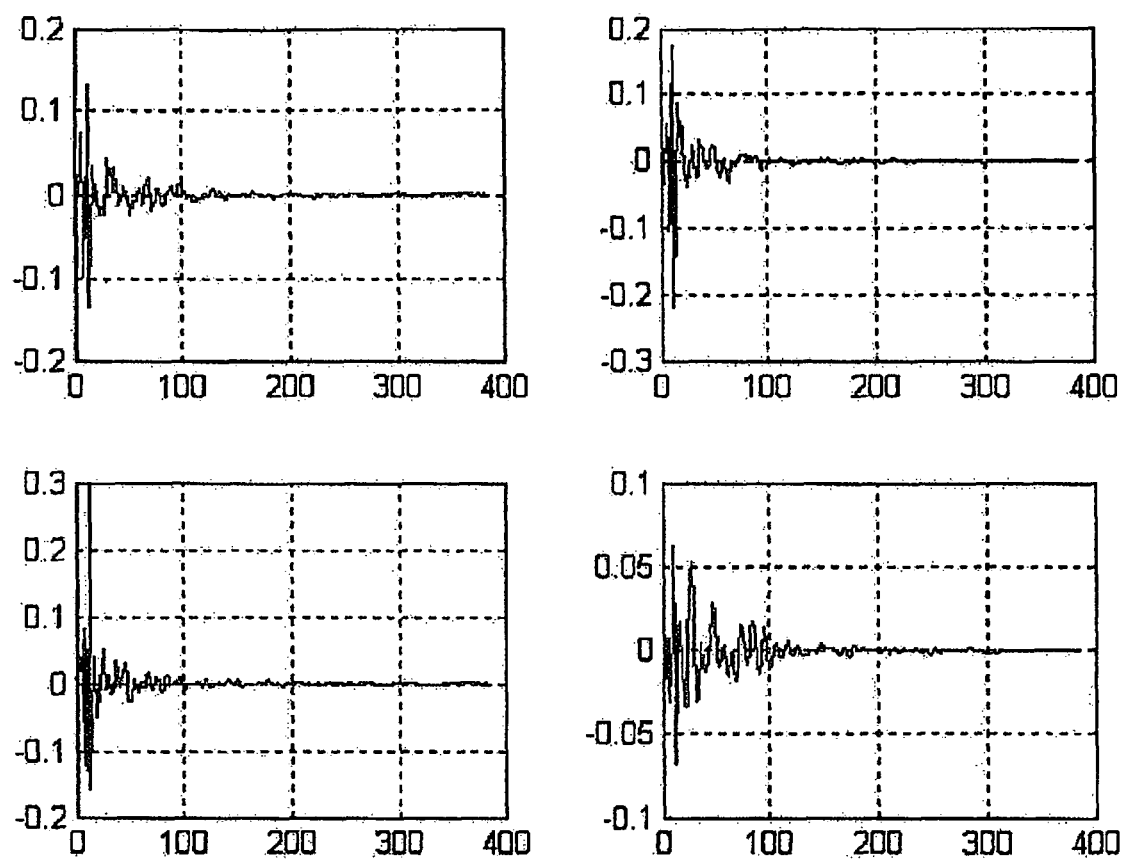
FIG. 25 depicts the corresponding filter impulse responses that result from an equalization system of FIG. 1.

FIG. 23 depicts the final result of performing the final global EQ in step 314 of FIG. 3. In FIG. 24, the group delay responses of the EQ filters of step 314 of FIG. 3 is shown. The corresponding filter impulse responses are shown in FIG. 25. They feature a minimum amount of pre-ringing before their peak. This confirms the success of the described method, the goal of which was to minimize latency.

Figure 26:
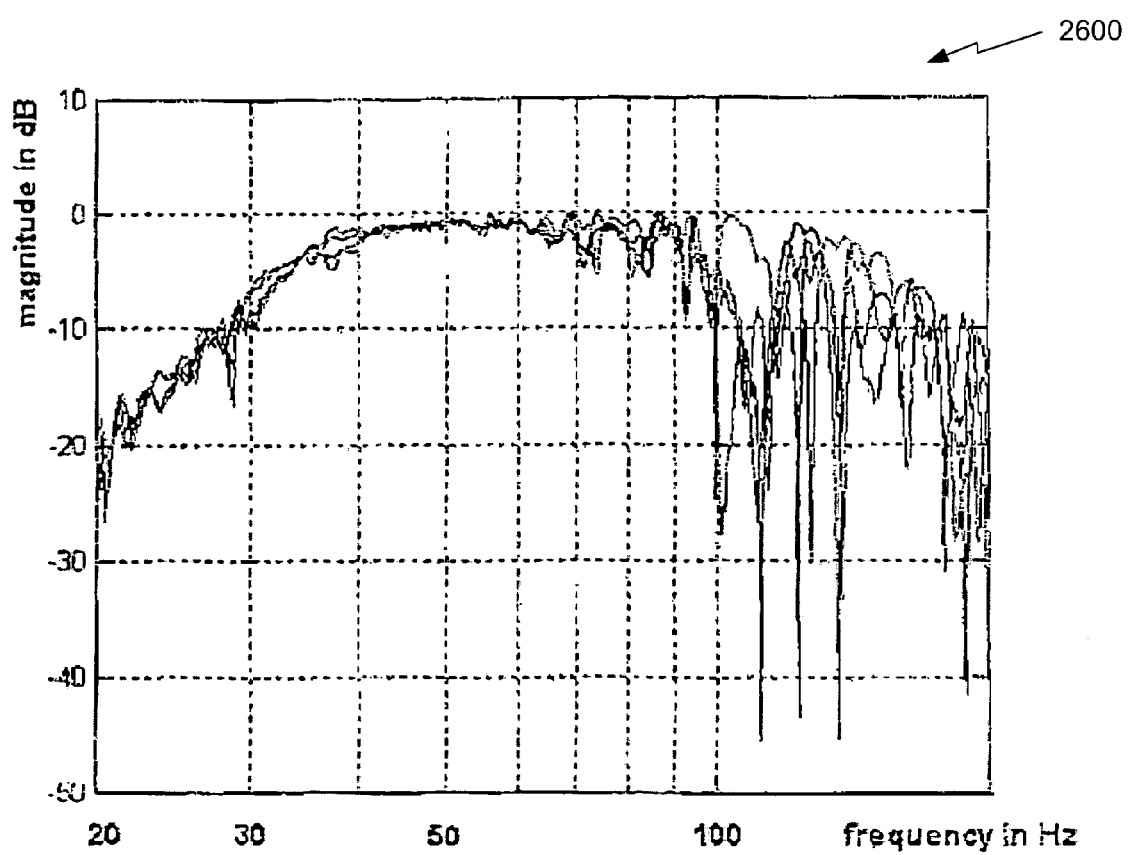
FIG. 26 illustrates the frequency responses of the room after the input signal to the corresponding subwoofers have been filtered to equalize the responses using the example equalization system of FIG. 1.

Finally, turning now to FIG. 26, FIG. 26 illustrates the frequency responses of the room after the input signal to the corresponding subwoofers have been filtered to equalize the responses using the example equalization system of FIG. 1. FIG. 26 illustrates that the resulting amplitude frequency responses are substantially consistent in the low frequency range relative to each other. This indicates that the responses at different locations within the listening room are substantially constant. This means that each person located at a listening position P1, P2, P3, or P4 is provided with a substantially similar loudness level at each frequency point. In addition, the magnitude level is substantially constant or flat across a desired low-frequency level of between about 40 Hz and about 100 Hz so that sound level dropping off is substantially minimized.

Persons skilled in the art will understand and appreciate, that one or more processes, sub-processes, or process steps described in connection with FIGS. 1 through 25 may be performed by hardware and/or software. Additionally, the low frequency equalization system may be implemented all, or in part, in software that would be executed within a processor or plurality of processor in a networked environment. Examples of a processor include but are not limited to microprocessor, general purpose processor, combination of processors, DSP, any logic or decision processing unit regardless of method of operation, instructions execution/system/apparatus/device and/or ASIC. If the process is performed by software, the software may reside in software memory (not shown) in the device used to execute the software. The software in software memory may include an ordered listing of executable instructions for implementing logical functions (i.e., "logic" that may be implemented either in digital form such as digital circuitry or source code or optical circuitry or chemical or biochemical in analog form such as analog circuitry or an analog source such an analog electrical, sound or video signal), and may selectively be embodied in any signal-bearing (such as a machine-readable and/or computer-readable) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "machine-readable medium," "computer-readable medium," and/or "signal-bearing medium" (herein known as a "signal-bearing medium") is any means that may contain, store, communicate, propagate, or transport the program for use by or in connection with the instruction execution system, apparatus, or device. The signal-bearing medium may selectively be, for example but not limited to, an electronic, magnetic, optical, electromagnetic, infrared, or semiconductor system, apparatus, device, air, water, or propagation medium. More specific examples, but nonetheless a non-exhaustive list, of computer-readable media would include the following: an electrical connection (electronic) having one or more wires; a portable computer diskette (magnetic); a RAM (electronic); a read-only memory "ROM" (electronic); an erasable programmable read-only memory (EPROM or Flash memory) (electronic); an optical fiber (optical); and a portable compact disc read-only memory "CDROM" "DVD" (optical). Note that the computer-readable medium may even be paper or another suitable medium upon which the program is printed, as the program can be electronically captured, via, for instance, optical scanning of the paper or other medium, then compiled, interpreted or otherwise processed in a suitable manner if necessary, and then stored in a computer memory. Additionally, it is appreciated by those skilled in the art that a signal-bearing medium may include carrier wave signals on propagated signals in telecommunication and/or network distributed systems. These propagated signals may be computer (i.e., machine) data signals embodied in the carrier wave signal. The computer/machine data signals may include data or software that is transported or interacts with the carrier wave signal.

Although the invention has been described with reference to a particular example of an embodiment, it will be apparent to those skilled in the art that various changes and modifications may be made without departing from the spirit and scope of the invention. Such changes and modification are intended to be covered by the appended claims.

What is claimed is:

1. A method to equalize frequency responses within a frequency range in a listening area, comprising:
    measuring frequency responses in the listening area generated by at least one acoustic transducer at an at least one listening point, resulting in a matrix of frequency responses;
    inverting the matrix of frequency responses to determine a vector of correction filters for the at least one acoustic transducer;
    performing a global magnitude equalization, with respect to a target function on a resulting vector of frequency responses that is the result of multiplying the vector of correction filters with the matrix of frequency responses;
    performing a global group delay equalization on the resulting vector of frequency responses, where performing a global group delay equalization further includes, replacing equalization filters by minimum-phase versions outside of a predetermined frequency range of 20 Hz-80 Hz where the at least one acoustic transducer operates in the frequency domain; and
    determining final equalization filters in a time domain with an inverse Fourier transform of the resulting vector of frequency responses after performance of the global group delay equalization.

2. The method to equalize frequency responses of claim 1, further includes performing an additional global equalization step on the equalization filters.

3. The method to equalize frequency responses of claim 1, where performing the global magnitude equalization with respect to the target function further includes limiting the global magnitude equalization to maximum gains associated with the resulting vector of frequency responses.

4. The method to equalize frequency responses of claim 3, where limiting the maximum gains occurs by clipping the maximum gains outside of a desired frequency range.

5. The method to equalize frequency responses of claim 4 where different values of maximum gains are applied to different frequency bands.

6. The method to equalize frequency responses of claim 1, includes obtaining the minimum-phase versions occurs with a Hilbert transform.

7. The method to equalize frequency responses of claim 1, farther includes applying a decreasing Butterworth type group delay response as an equalization allpass filter applied to the resulting vector of frequency responses.

8. The method to equalize frequency responses of claim 1, where measuring frequency responses in the listening area is accomplished by at least one microphone.

9. The method to equalize frequency responses of claim 8 includes, placing the at least one microphone in a listening positioning within the listening room.

10. A system of low frequency equalization of an audio signal within a listening area, comprising:
    an at least one means for measuring frequency responses in the listening area;
    a signal block in receipt of the frequency responses that generates filter coefficients in response to the frequency responses;
    a processor that implements at least one filter with the coefficients from the signal block to filter and processes the audio signal, where a minimum-phase version of the at least one filter replaces the at least one filter outside a predetermined frequency band of 20 Hz-80 Hz and global equalization of the audio signal occurs in a time domain.

11. The system of low frequency equalization of claim 10, further includes a final equalization spectrum determined by the processor.

12. The system of low frequency equalization of claim 11, further includes a limit on a gain associated with the audio signal received by the measuring means.

13. The system of low frequency equalization of claim 10, where a bandpass target filter defines the predetermined frequency band.

14. The system of low frequency equalization of claim 10, where a normalization of an equalization filters group delay responses in the processor results in minimized frequency-dependent, absolute values of a delay in the audio signal such that relative phase relationships are preserved.

15. The system of low frequency equalization of claim 14, where an allpass correction filter with a decreasing Butterworth type group delay response is applied by the processor to the audio signal after the equalization filters are applied.

16. The system of low frequency equalization of claim 10, where the at least one means for measuring is at least one microphone.

17. The system of low frequency equalization of claim 16, where the at least one microphone is located in a listening position within the listening area.

18. A system to equalize frequency responses within a frequency range in a listening area, comprising:

means for measuring frequency responses in the listening area generated by at least one acoustic transducer at an at least one listening point, that results in a matrix of frequency responses;

means for inverting the matrix of frequency responses to determine a vector of correction filters for the at least one acoustic transducer;

means for performing a global magnitude equalization with respect to a target function on the resulting frequency, responses that result after multiplying the vector of correction filters with the matrix of frequency responses;

means for performing a global group delay equalization on the resulting frequency responses, where performing a global group delay equalization further includes, replacing equalization filters by minimum-phase versions outside of a predetermined frequency range of 20 Hz-80 Hz where the at least one acoustic transducer operates while still in the frequency domain; and means to determine final equalization filters in the time domain with an inverse Fourier transform of the resulting frequency responses.

19. The system to equalize frequency responses of claim 18, further includes a means for determining a global correction filter response that limits the resulting frequency responses to a maximum gain.

20. The system to equalize frequency responses of claim 19, where means for limiting to the maximum gain, occurs by a means for clipping the maximum gain outside of a desired frequency range.

21. The system to equalize frequency responses of claim 20 where different values of maximum gains are applied to different frequency bands.

22. The system to equalize frequency responses of claim 18, includes obtaining the minimum-phase versions with a Hilbert transform.

23. The system to equalize frequency responses of claim 18, further includes means for applying a decreasing Butterworth type group delay response as a global group delay equalization applied to the resulting frequency responses.

24. The system to equalize frequency responses of claim 18, where means for measuring frequency responses in the listening area is accomplished by at least one microphone.

* * * * *